United States Patent
Lasiter et al.

(10) Patent No.: US 11,711,594 B2
(45) Date of Patent: Jul. 25, 2023

(54) DUAL IMAGE SENSOR PACKAGE

(71) Applicant: QUALCOMM Incorporated, San Diego, CA (US)

(72) Inventors: Jon Lasiter, Stockton, CA (US); Ravindra Vaman Shenoy, Dublin, CA (US); Ravishankar Sivalingam, San Jose, CA (US); Russell Gruhlke, San Jose, CA (US); Donald William Kidwell, Campbell, CA (US); Khurshid Syed Alam, Mountain View, CA (US); Kebin Li, Fremont, CA (US)

(73) Assignee: QUALCOMM Incorporated, San Diego, CA (US)

( * ) Notice: Subject to any disclaimer, the term of this patent is extended or adjusted under 35 U.S.C. 154(b) by 173 days.

(21) Appl. No.: 17/188,360

(22) Filed: Mar. 1, 2021

(65) Prior Publication Data
US 2022/0279137 A1    Sep. 1, 2022

(51) Int. Cl.
*H04N 5/33* (2023.01)
*H01L 27/146* (2006.01)
*H04N 23/11* (2023.01)

(52) U.S. Cl.
CPC ....... *H04N 23/11* (2023.01); *H01L 27/14618* (2013.01); *H01L 27/14621* (2013.01); *H01L 27/14627* (2013.01)

(58) Field of Classification Search
CPC .. H04N 5/2253; H04N 5/2254; H04N 5/2258; H04N 5/23238
See application file for complete search history.

(56) References Cited

U.S. PATENT DOCUMENTS

2005/0264677 A1* 12/2005 Uchida ............. H01L 27/14618
                                                     348/340
2007/0097249 A1*  5/2007 Korenaga ............ G02B 5/1876
                                                     348/335

(Continued)

FOREIGN PATENT DOCUMENTS

EP         1603165       12/2005
WO    WO 2017023211       2/2017
WO    WO-2018139255 A1 *  8/2018 ......... G02B 13/0085

OTHER PUBLICATIONS

"A simply integrated dual-sensor based non-intrusive iris image acquisition system"—Jang-Hee Yoo; Byung Jun Kang; 2015 IEEE Conference on Computer Vision and Pattern Recognition Workshops (CVPRW); Date of Conference: Jun. 7-12, 2015 (Year: 2015).*

(Continued)

*Primary Examiner* — Mainul Hasan
(74) *Attorney, Agent, or Firm* — Qualcomm Incorporated

(57) ABSTRACT

An image sensor device includes two or more image sensor arrays (or two or more regions of an image sensor array) and a low-power processor in a same package for capturing two or more images of an object, such as an eye of a user, using light in two or more wavelength bands, such as visible band, near-infrared band, and short-wave infrared band. The image sensor device includes one or more lens assemblies and/or a beam splitter for forming an image of the object on each of the two or more image sensor arrays. The image sensor device also includes one or more filters configured to select light from multiple wavelength bands for imaging by the respective image sensor arrays.

30 Claims, 16 Drawing Sheets

(56) References Cited

U.S. PATENT DOCUMENTS

| | | | |
|---|---|---|---|
| 2009/0244717 A1* | 10/2009 | Tocci | H04N 25/581 |
| | | | 359/636 |
| 2012/0104526 A1 | 5/2012 | Olsen et al. | |
| 2014/0320621 A1* | 10/2014 | Sonnenschein | H04N 23/57 |
| | | | 348/294 |
| 2018/0020179 A1* | 1/2018 | Wan | H04N 23/45 |
| 2019/0189696 A1* | 6/2019 | Yamaguchi | H04N 23/12 |
| 2020/0344413 A1* | 10/2020 | Lasiter | H04N 23/54 |
| 2021/0195077 A1* | 6/2021 | Park | H01L 27/14665 |

OTHER PUBLICATIONS

International Search Report and Written Opinion—PCT/US2022/070127—ISA/EPO—dated Jul. 8, 2022.
Partial International Search Report—PCT/US2022/070127—ISA/EPO—dated May 16, 2022.

* cited by examiner

DUAL IMAGE SENSOR PACKAGE

BACKGROUND

Computer vision involves acquiring, processing, analyzing, and understanding images for use in various applications. In a computer vision system, an optical subsystem may form optical images of objects, scenes, events, or other environmental features onto an image sensor. The image sensor may capture images or videos of the environmental features by converting optical images into electrical image data. An image processor coupled to the image sensor may perform certain computer vision operations on the acquired image data to detect features in the image data and/or changes among different frames in the image data. The detected features and/or changes may be used in a variety of applications, such as object classification, face recognition, motion detection, object/feature tracking, gesture detection, user authentication, autonomous driving, and the like. For example, features extracted from images or videos can be used for liveness detection and/or biometric authentication to prevent spoofing. The electrical image data generated by the image sensor can also be used in other applications, such as depth-sensing, location tracking, augmented reality (AR), virtual reality (VR), mixed reality (MR) applications, and the like. For example, in VR/AR/MR display system, image sensors can be used to track the movement of user's eyes in order to display appropriate content to user's eyes.

SUMMARY

Techniques disclosed herein relate generally to image sensors. More specifically, disclosed herein are image sensor devices for capturing multiple images of an object using light in multiple wavelength ranges. Various inventive embodiments are described herein, including devices, systems, components, packages, circuits, apparatuses, methods, materials, and the like.

According to certain embodiments, an image sensor device may include a circuit board, a processor bonded to the circuit board, a first sensor array bonded to and electrically coupled to the processor, a first cover glass on the first sensor array, a second sensor array bonded to and electrically coupled to the processor, a second cover glass on the second sensor array, and an encapsulation structure on the circuit board and surrounding the processor, the first sensor array, the first cover glass, the second sensor array, and the second cover glass. The image sensor device may also include a package top cover on the encapsulation structure, the package top cover including a first aperture and a second aperture aligned with the first sensor array and the second sensor array respectively. The image sensor device may further include a first lens in the first aperture, a second lens in the second aperture, and a filter on a surface of at least one of the first lens, the first cover glass, or the first sensor array. The filter is configured to block light in a first wavelength range and transmit light in a second wavelength range. In some embodiments, the filter may be configured to block visible light and transmit infrared light (e.g., near-infrared (NIR) or short-wave IR (SWIR) light).

In accordance with an example implementation, an image sensor device may include a circuit board; a processor bonded to the circuit board; a first sensor array bonded to and electrically coupled to the processor; a first cover glass on the first sensor array; a second sensor array bonded to and electrically coupled to the processor; a second cover glass on the second sensor array; an encapsulation structure on the circuit board and surrounding the processor, the first sensor array, the first cover glass, the second sensor array, and the second cover glass; a package top cover on the encapsulation structure, the package top cover including an aperture; a lens in the aperture; and a filter on a surface of at least one of the first cover glass or the first sensor array, the filter configured to block light in a first wavelength range and transmit light in a second wavelength range.

In accordance with an example implementation, an optical sensor package may include a circuit board; a processor bonded to the circuit board; a sensor array bonded to and electrically coupled to the processor; a cover glass on the sensor array; an encapsulation structure on the circuit board and surrounding the processor, the sensor array, and the cover glass; a top cover on the encapsulation structure, the top cover including an aperture; a lens assembly in the aperture; and a filter on a region of at least one of the lens assembly, the cover glass, or the sensor array, the filter configured to block light in a first wavelength range and transmit light in a second wavelength range.

According to certain embodiments, an apparatus in a package may include means for focusing light reflected by an object, the light reflected by the object including light in a first wavelength range and light in a second wavelength range; means for blocking the light in the second wavelength range and transmitting the light in the first wavelength range; means for receiving and converting the light in the first wavelength range into electrical data for a first image; means for receiving and converting the light in the second wavelength range into electrical data for a second image; means for receiving and processing both the electrical data for the first image and the electrical data for the second image; means for encapsulating the means for receiving and converting the light in the first wavelength range, the means for receiving and converting the light in the second wavelength range, and the means for receiving and processing both the electrical data for the first image and the electrical data for the second image; and means for holding the means for focusing light reflected by the object, wherein the means for holding is on the means for encapsulating and is opaque to light in the first wavelength range and light in the second wavelength range.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Aspects of the present disclosure are illustrated by way of example. Non-limiting and non-exhaustive aspects are described with reference to the following figures.

Figure 1A:
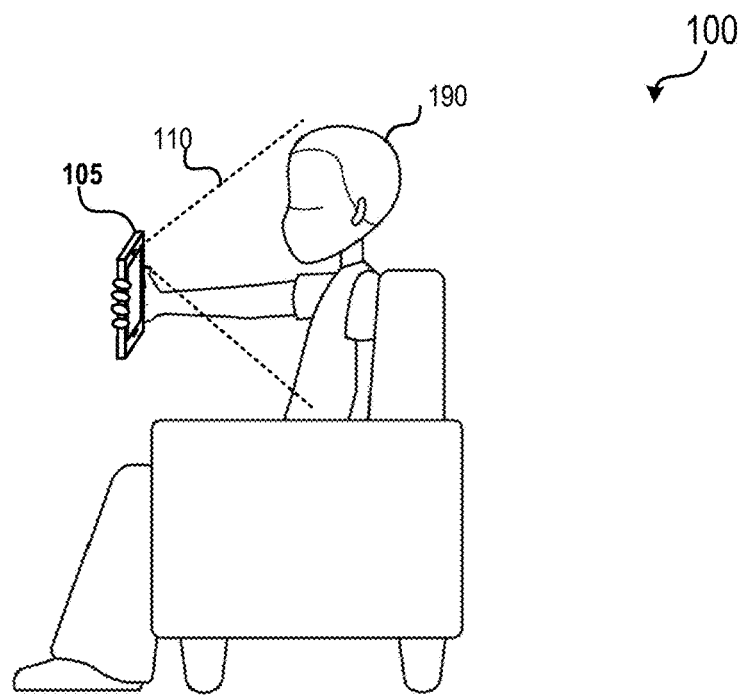
FIG. 1A illustrates an example of a setup in which a user may interact with a mobile device that incorporates the features and techniques described herein.

In the figures, like reference numerals refer to like parts throughout various figures unless otherwise specified. In addition, multiple instances of a component may be distinguished by following the reference numeral by a second label (e.g., a letter or a number), or a dash and a second label. If only the first reference label is used in the specification, the description is applicable to any one of the similar components having the same first reference numeral irrespective of the second label.

DETAILED DESCRIPTION

This disclosure relates generally to image sensors. More specifically, disclosed herein are image sensor devices for capturing multiple images of an object using light in multiple wavelength ranges. Various inventive embodiments are described herein, including devices, systems, packages, circuits, apparatuses, components, methods, materials, and the like.

A near-eye display system, such as some virtual reality (VR) or augmented reality (AR) display systems, may include one or more eye-tracking systems for determining an eye's position, including the orientation and location of the eye, in order to display appropriate content from appropriate perspectives to user's eyes. An eye-tracking system may include an imaging system (e.g., a camera or another image sensor) that captures light reflected by the user's eye. In some embodiments, an eye-tracking system may also include a light source (e.g., an light emitting diode or another illuminator) that may emit light (e.g., infrared light) to illuminate an eye. The near-eye display system may use images of the eye to, for example, determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), and the like. In addition to eye tracking, it may also be desirable to capture images of the iris of a user's eye, which may have a complex and stable pattern that can be used for biometric authentication.

A majority of the people in the world have dark brown irises, while some other people may have blue irises. For eyes with different iris colors, the quality of the images captured using light in different wavelength bands (e.g., visible wavelength band, near-infrared (NIR) band, short-wave infrared (SWIR) band, etc.) may be different. For example, for dark brown irises, images captured using visible light may appear dark and may reveal less visible texture, while images captured using NIR light may reveal rich features of the irises. Using the MR spectrum may also enable the blocking of corneal specular reflections in a bright ambient environment and allow only NIR light from a narrow-band illuminator to reach the camera sensor. However, for blue irises, imaging using visible light may reveal rich iris features, while images captured using NIR light may appear dark. Therefore, to capture eye features for a large population, eye tracking/imaging using both visible light and IR light may be desired. In general, two image sensors may be used to image irises of any color. For example, visible light (e.g., from about 400 nm to about 750 nm) sensors may be used to capture detailed features of blue irises, while near-infrared (e.g., from about 750 nm to about 1000 nm) sensors may capture high-quality images for brown irises. Existing techniques may use two or more separate image sensor devices in separate packages to capture multiple iris images using light in multiple wavelength bands, where a separate image sensor device (in a separate package) may be used for each wavelength range (e.g., visible, NIR, SWIR, etc.). Each image sensor device may include a lens assembly, an image sensor die, and a processing unit in a respective package. Including multiple image sensor devices in a near-eye display system may increase the physical dimension, cost, and power consumption of the system. Hyperspectral imaging techniques may be used for imaging in multiple wavelength bands. However, hyperspectral imaging cameras are generally expensive and bulky, and thus may not be suitable for use in compact, mobile systems such as near-eye display systems or other AR/VR systems.

According to certain embodiments, an image sensor device may include two or more image sensor arrays and a low-power processor in a same package for capturing two or more images of an object, such as an eye of a user. The two or more image sensor arrays may have different working wavelength ranges or may have a wide working wavelength range that covers multiple wavelength bands, and thus may capture images using light in different wavelength ranges, such as visible light, NIR light, SWIR light, and the like. The low-power processor may control and manage the two image sensor arrays, and/or may process the image data captured by the two image sensor arrays. One or more lens assemblies may be used to form an image of the object on each of the two or more image sensor arrays.

In some embodiments, two or more separate lens assemblies may be used, where each lens assembly may be designed and optimized for a different respective wavelength range. In some embodiments, each lens assembly may be configured to have different fields of view, different focal lengths and thus different magnifications, different focal plane distances, different heights, and the like. In some embodiments, one lens assembly may be used to project imaging light onto the two image sensor arrays through a beam splitter (e.g., a prism), where the imaging light may be split by the beam splitter into two beams that each reach a respective image sensor array. One or more filters may be used to select light from the multiple wavelength bands for imaging by the respective image sensor array.

Main components of the device can be integrated into a single package, for example, using overmolding technique. The lens assemblies and the image sensor arrays can have very small sizes, such as having a linear dimension less than about 2 mm, less than about 1 mm, or less than about 0.5 mm. Therefore, the physical dimension of the package can be small, such that it can be easier to integrate the package into a compact, mobile system, such as a pair of AR/VR glasses. Thus, techniques disclosed herein can achieve multi-wavelength imaging of an object using a single image sensor device in a single robust package that has a small form factor. The power consumption may also be reduced due to the use of the single low-power processor for controlling and managing the two image sensor arrays and for data processing. Therefore, image sensor devices disclosed herein are particularly suitable for use in mobile devices or wearable devices, such as near-eye display systems for AR/VR applications.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In some instances, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1A illustrates an example of a setup 100 in which a user 190 may interact with a mobile device 105 that incorporates certain features and techniques described herein. In the illustrated example, user 190 may interact with mobile device 105, at least in part, via a sensor system that includes a camera, dedicated computer vision (CV) computation hardware, and a dedicated low-power microprocessor as described below. It is understood that "low-power" here is intended to refer to electrical power, not computational power. These features enable mobile device 105 to detect, track, recognize, and/or analyze a subject (such as user 190 or a body part of user 190, such as an eye of user 190) and other objects and scenes within an FOV 110 of the camera. The sensor system may capture and process information received by the camera using the embedded microprocessor, and send "events" or other indications that one or more objects are detected or one or more activities (e.g., eye blinking) have occurred to a general-purpose processor only when needed or as defined and configured by the application. This allows the general-purpose processor (which is typically relatively high-speed and high-power to support a variety of applications) to stay in a low-power mode (e.g., sleep mode) most of the time, while becoming active only when events or other indications are received from the sensor system. While illustrated and described with reference to mobile device 105 capturing images of a user or the face of the user, it is understood that the sensor system described herein is capable of performing the common image capturing (e.g., photography), object recognition, motion detection, barcode or Quick Response (QR) code scanning, and the like, and can be useful in a variety of applications including interne of things (IoT) applications.

In some embodiments, the dedicated CV computation hardware may compute or is capable of computing CV features, such as localized CV features for each sensor element (e.g., pixel) in a sensor array unit, based on, at least in part, signals associated with neighboring sensor elements. As used herein, the term "local" or "localized" refers to features computed based on one or more neighboring sensor elements rather than statistical or other mathematical evaluation of the entire image. As described herein, sensor elements (e.g., pixels) including a subject sensor element and other sensor elements relatively close to the subject sensor element may be referred to as neighboring sensor elements. In certain aspects of the disclosure, the neighboring sensor elements may include the subject sensor element and sensor elements immediately adjacent to the subject sensor element. In some embodiments, neighboring sensor elements may also include sensor elements that are relatively close to the subject sensor element but are not immediately adjacent to the subject sensor element. For example, in certain instances, sensor elements within three sensor elements from the subject sensor element may still be considered neighboring sensor elements. In some embodiments, CV features or localized CV features may include low level computer vision markers or indicators, such as labels associated with each sensor element of the sensor system. Such localized CV features may include outputs such as a Histogram of Signed Gradients (HSG) and/or a Local Binary Pattern (LBP).

In setup 100 illustrated in FIG. 1, user 190 may have picked up mobile device 105 while the mobile device's general-purpose processor is in a sleep mode. The sensor system of mobile device 105, however, may remain active and may be capable of, for example, recognizing the face of user 190, a hand gesture, a facial expression (e.g., eye blink), other objects in the scene, and the like. Upon recognizing the occurrence of certain target events, such as the specific facial features of user 190 moved within the sensor system's field of view 110, the sensor system may send an event or another notification to the mobile device's general-purpose processor indicating that the facial features of user 190 have been detected and recognized, thereby causing the mobile device's general-purpose processor to exit the low-power mode and become fully active.

Target events that may trigger the sensor system to send an event to the mobile device's general-purpose processor may include any of a variety of CV-detectable events, depending on desired functionality. These events may include, for example, facial and/or object detection, facial and/or object recognition, iris recognition, gesture recognition, facial and/or object movement detection, and the like. In some embodiments, one or more target events may be configured by user 190.

In some embodiments, the camera may perform pixel-level computer vision feature computations like LBPs, Gradients, Edges, HSGs, and/or other operations in which readings from neighboring sensor pixels of the camera are used to compute CV features for a low-power hardware-based computation of the CV features.

Although the sensor system described with respect to FIG. 1 may include a special-purpose camera for CV applications, embodiments are not so limited. The sensor system and the techniques disclosed herein may be used to click photographs or shoot videos. Additionally, although FIG. 1 and other embodiments describe a sensor system being incorporated into a mobile device, embodiments are not so limited. Image quality improvement brought by the techniques and features described herein can have particular benefits to compact mobile devices, such as sports cameras, mobile phones, tablets, laptops, portable media players, and the like, due to the cost and size constraints. Other devices that include image sensors, such as desktop computers, vehicles (e.g., autonomous vehicles or unmanned aerial vehicles), close-circuit security cameras, or the like, may utilize the features and techniques described herein.

Figure 1B:
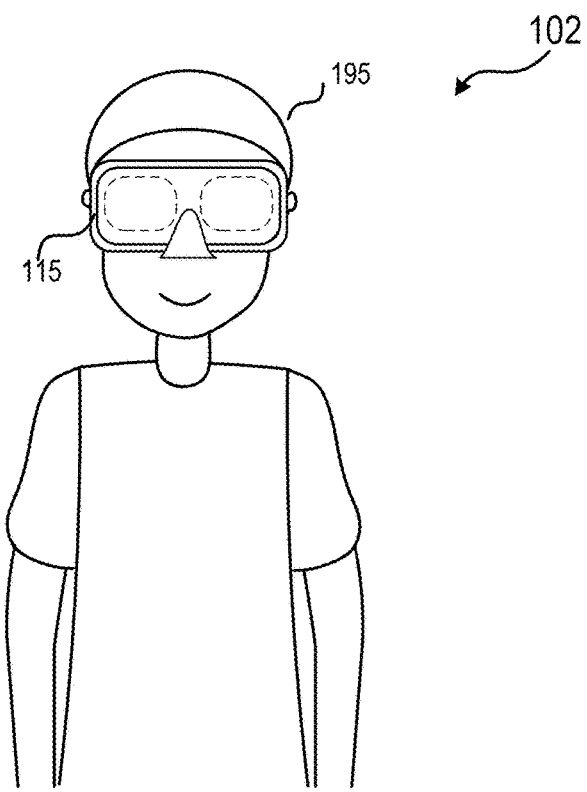
FIG. 1B illustrates another example of a setup in which a user may interact with a wearable device that incorporates the features and techniques described herein.

FIG. 1B illustrates another example of a setup 102 in which a user 195 may interact with a wearable device 115 that incorporates features and techniques described herein. In the illustrated example, wearable device 115 may include a near-eye display device, such as an artificial reality display device for artificial reality, augmented reality, or mixed reality applications. In some embodiments, wearable device 115 may be in the form of a pair of glasses. Wearable device 115 may include various sensors, such as cameras, motion sensors, eye-tracking sensors, and the like.

In one example, wearable device 115 may include an eye imaging system that may include one or more light sources (e.g., visible and/or infrared light source) that may emit light to illuminate the eyes of user 195. Wearable device 115 may also include a camera that collects light reflected by the user's eyes to form one or more image of the user's eyes. Wearable device 115 may use images of the eyes to, for example, determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), determine liveness of the user (determining if a user is awake while driving), and the like. In addition to eye tracking, wearable device 115 may also capture images of the irises of the user's eyes, which may have a complex and stable pattern that can be used for applications such as biometric authentication.

Figure 2:
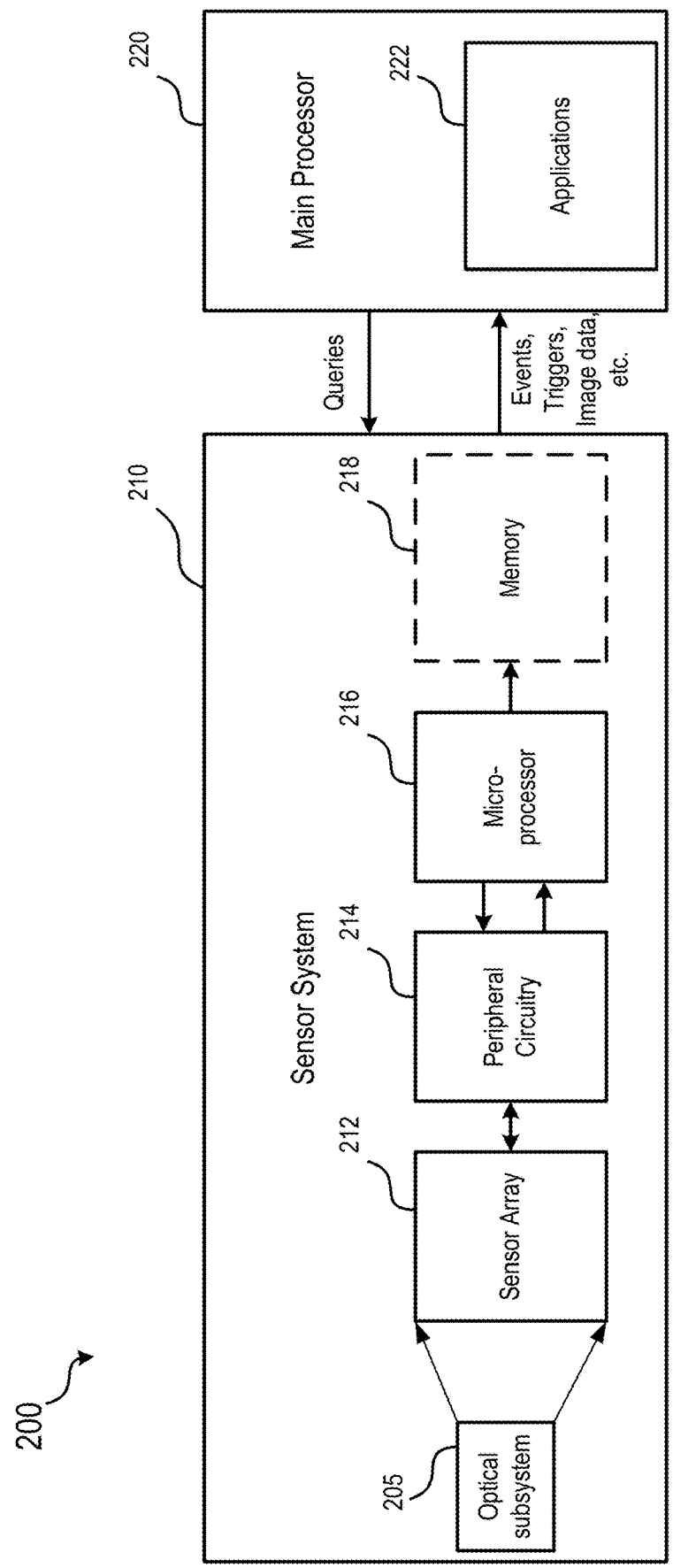
FIG. 2 is a block diagram of an example of a computer vision system including an image sensor and a main processor according to certain embodiments.

FIG. 2 illustrates a block diagram of an example of a computer vision system 200 including a sensor system 210 and a main processor 220 according to certain embodiments. Computer vision system 200 may be an example of the sensor system of mobile device 105. According to one embodiment, sensor system 210 may be configured to enable high-level sensing operations, while main processor 220 may normally operate in a low-power (e.g., "sleep" or "stand-by") mode. Components of FIG. 2 can be incorporated into a larger electronic device, such as a sports camera, mobile phone, tablet, laptops, security camera, or the like.

As illustrated in FIG. 2, sensor system 210 may include an optical subsystem 205, a sensor array 212, peripheral circuitry 214, a microprocessor 216, and/or memory 218. Sensor array 212, peripheral circuitry 214, microprocessor 216, and/or memory 218 may be integrated into a same image sensor chip or a same package. Sensor system 210 can be communicatively coupled through either a wired or wireless connection to main processor 220 of an electronic device (such as an application processor of a mobile phone), which can send queries to the sensor system 210 and receive events and/or other triggers from the sensor system 210. In some implementations, microprocessor 216 can correspond to a dedicated microprocessor or a first processing unit, and can be configured to consume less electrical power than main processor 220, which can correspond to a second processing unit. In various embodiments, computation and processing functionality may be distributed in various ways across microprocessor 216 and main processor 220.

Optical subsystem 205 may include, for example, an optical lens or an array of micro-lenses that can focus light from environmental features (e.g., objects and scenes) to form an optical image of the environmental features onto sensor array 212. The optical lens may include a single lens or a group of lenses. For example, the optical lens may include a spherical lens or an aspherical lens that is designed to have small optical aberrations. The optical lens may have a short focal length, such that the optical image can have a small size and the optical lens can be positioned close to sensor array 212 to reduce the physical size of sensor system 210. The optical image may have a size comparable to the size of sensor array 212. In some embodiments, optical subsystem 205 may include one or more filters, such as color filters (e.g., visible, ultraviolet, or infrared light filters), polarizing filters, neutral density filters, close-up filters, and the like.

Sensor array 212 may include an array (e.g., a one- or two-dimensional array) of sensor cells (or pixels) for sensing optical signals. Sensor array 212 can include, for example, a CCD image sensor that includes arrays of photosensors and metal-oxide-semiconductor (MOS) capacitors, or a CMOS APS image sensor that includes arrays of photodiodes and MOS field-effect transistor (MOSFET) amplifiers.

In some embodiments, sensor array 212 may include some memory and/or logic circuitry with which operations on one or more outputs of the sensor cells may be performed. In some embodiments, each sensor pixel in the sensor array may be coupled to the memory and/or logic circuitry, which may or may not be part of the peripheral circuitry 214. The output of sensor array 212 and/or peripheral circuitry 214 may include output data in addition or as an alternative to the raw sensor readings of the sensor cells. For example, in some embodiments, sensor array 212 and/or peripheral circuitry 214 can include dedicated CV computation hardware. CV features can be computed or extracted by the dedicated CV computation hardware using readings from neighboring sensor pixels of sensor array 212. The computed or extracted CV features can include, for example, a computed HSG and/or an LBP feature, label, or descriptor. Other CV computations can also be performed based on other CV computation algorithms, such as edge detection, corner detection, scale-invariant feature transform (or SIFT), speeded up robust features (SURF), histogram of oriented gradients (HOG), local ternary patterns (LTPs), and the like, as well as extensions of any of the above algorithms.

The synchronicity (or asynchronicity) of sensor array 212 may also depend on desired functionality. For example, in some embodiments, sensor array 212 may include a frame-based readout circuitry timed to provide periodic sampling of each pixel. In some embodiments, sensor array 212 may include an event-driven array, where sensor output may be generated when a sensor reading or another output reaches a certain threshold value or changes by a certain threshold value, rather than (or in addition to) adhering to a particular constant sampling rate.

Peripheral circuitry 214 may receive information from sensor array 212. In some embodiments, peripheral circuitry 214 may receive information from some or all pixels within sensor array 212, some or all in-pixel circuitry of sensor array 212 (in implementations with significant in-pixel circuitry), or both. In embodiments where sensor array 212 provides a synchronized output, peripheral circuitry 214 may provide timing and/or control operations on the sensor array unit output (e.g., execute frame-based and/or similar timing). Other functionality provided by the peripheral circuitry 214 can include an event-queuing and/or processing operation, analog processing, analog-to-digital conversion, an integration operation (e.g. a one- or two-dimensional integration of pixel values), CV feature computation, object classification (for example, cascade-classifier-based classification or histogram-based classification), histogram operation, memory buffering, or any combination thereof.

Some embodiments may include microprocessor 216 coupled to the output of peripheral circuitry 214. Microprocessor 216 may generally include a processing unit that operates on relatively low power compared with main processor 220. In some implementations, microprocessor 216 can further execute certain computer vision and/or machine-learning algorithms (which can be frame- and/or event-based). Thus, microprocessor 216 may be able to perform certain computer vision and/or machine learning functions based on data received from sensor array 212 while main processor 220 operates in a low-power mode. When microprocessor 216 determines that an event or condition that may need to be handled by main processor 220 has taken place, microprocessor 216 can communicate with main processor 220 regarding the event or condition to bring main processor 220 out of its low-power mode and into a normal operating mode.

In some embodiments, the output of microprocessor 216 may be provided to memory 218 before being sent to main processor 220. In some implementations, memory 218 may be shared between microprocessor 216 and main processor 220. Memory 218 may include working memory and/or data structures maintained by microprocessor 216. Memory may be utilized, for example, for storing images, tracking detected objects, and/or performing other operations. Additionally or alternatively, memory 218 can include information that main processor 220 may query from sensor system 210. Main processor 220 can execute applications 222, some of which may utilize information received from sensor system 210.

The ability of sensor system 210 to perform certain functions, such as image processing and/or computer vision functions (e.g., eye tracking or iris recognition) independent of main processor 220 can provide for power, speed, and memory savings in an electronic device that would otherwise utilize main processor 220 to perform some or all of image processing functions. In one example, a mobile phone having the configuration shown in FIG. 2 can use facial detection to exit out of a standby mode. In this example, the mobile phone enters into a standby mode in which a display of the mobile phone is powered down, while main processor 220 operates in a low-power or sleep mode. However, sensor system 210 with an image array (e.g., sensor array 212) may continue to capture and process image data at a certain rate (e.g., a few samples per second) while objects enter and exit the field of view of sensor system 210. When a face enters the field of view of sensor system 210, the face may be imaged by optical subsystem 205 onto sensor array 212, and detected by sensor array 212, peripheral circuitry 214, microprocessor 216, or any combination thereof. If the detected face remains in the field of view of sensor system 210 for a certain period of time (e.g., 0.5 seconds, 1 second, 2 seconds, etc.), microprocessor 216 may send an a facial-detection event to main processor 220, indicating that a face is detected. Main processor 220 and the display of the mobile phone may then be switched back to normal operating mode.

It is noted that alternative embodiments may vary from the components shown in FIG. 2. For example, embodiments of sensor system 210 may or may not include peripheral circuitry 214, microprocessor 216, and/or memory 218. Additionally or alternatively, embodiments may combine, separate, add, omit, and/or rearrange the components of FIG. 2, depending on desired functionality.

Figure 3:
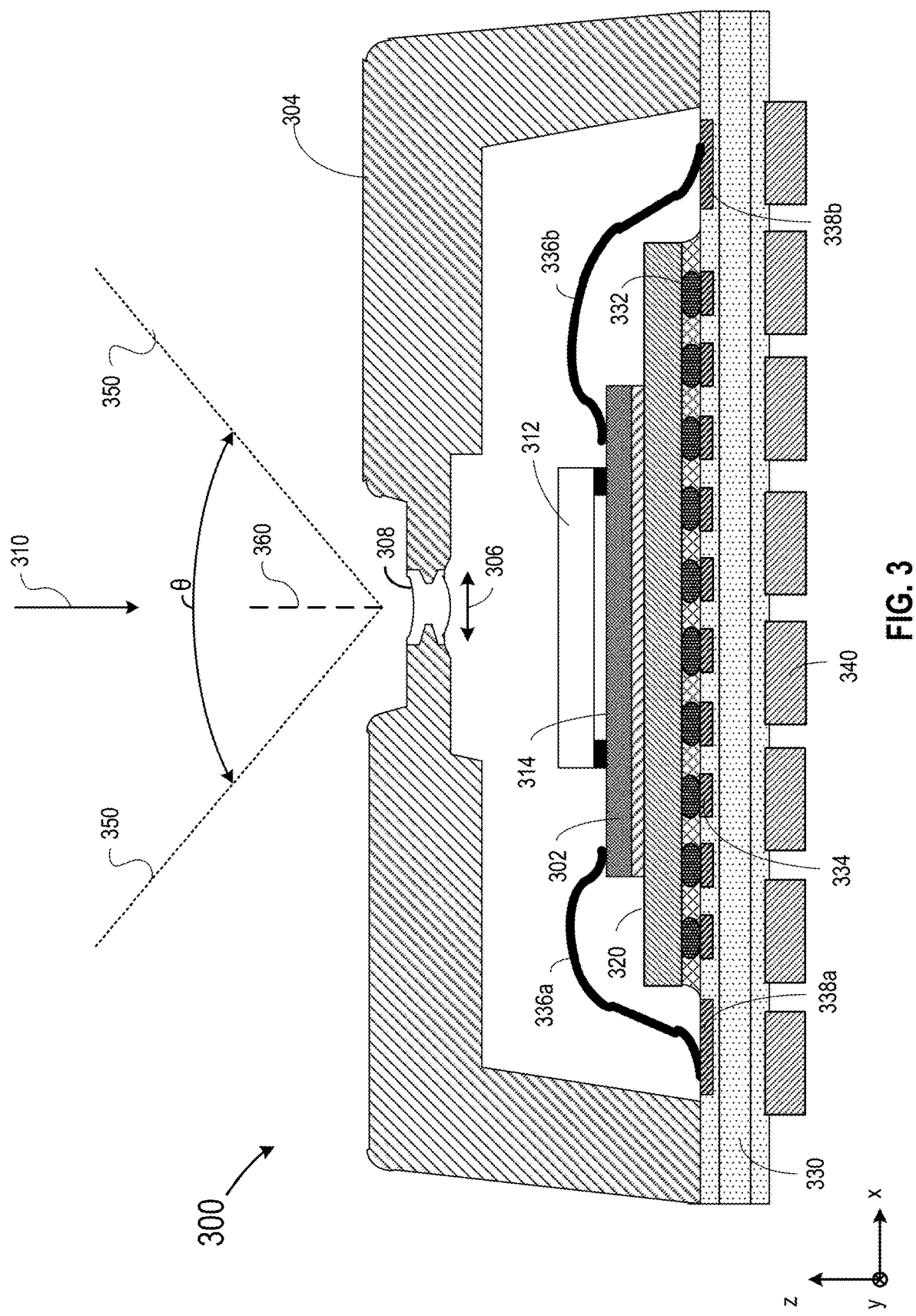
FIG. 3 includes a cross-sectional view of an example of an image sensor according to certain embodiments.

FIG. 3 illustrates an example of an image sensor 300 according to certain embodiments. Image sensor 300 may be an example of sensor system 210 shown in FIG. 2. Image sensor 300 can be part of a mobile device, such as a smart phone, a laptop, a camera, an Internet-of-Thing (IoT) device, and the like. For example, image sensor 300 may be a part of mobile device 105. Image sensor 300 can also be part of near-display system for AR/VR applications. For example, image sensor 300 may be used to track, for example, a handheld controller, user's body parts (e.g., arms or hands), user's eyes, and the like.

In the illustrated example, image sensor 300 includes a sensor array 302 (e.g., sensor array 212) housed within a cover 304. Cover 304 may be made of a polymer material or another dielectric material to provide physical protection and insulation to sensor array 302. Cover 304 may include a window 306 in which a single lens 308 can be mounted. Lens 308 may be an aspherical lens that may have a short focal lens and a wide angle of view range, thus allowing features in a large field of view to be included in a captured photograph. In some embodiments, image sensor 300 may include a cover glass 312 mounted on top of a surface 314 of sensor array 302 to protect sensor array 302. In some implementations, image sensor 300 may further include one or more optical filters (e.g., a Bayer filter array, not shown in FIG. 3) to filter or modify the light (e.g., the intensity, phase, color, or polarization of the light) received by each element (also referred to as a pixel or a cell) of sensor array 302. In some embodiments, cover glass 312 may be one of the one or more optical filters.

Sensor array 302 can be configured to detect light 310 that is collected and focused by lens 308. Sensor array 302 may be configured to detect light on the front side or the back side. Sensor array 302 may include an array of pixels. Each pixel in the array may include a photosensor, such as a photodiode that can generate an electrical voltage or current signal corresponding to the intensity of the optical signal illuminating the pixel. For example, each pixel may convert the optical signal incident on the pixel to an electrical current or integrate the current using a capacitor to generate a voltage signal. The current or voltage signal may be converted to digital pixel data by an analog-to-digital converter. Therefore, each pixel may generate digital pixel data representing an intensity of light 310 received by the pixel. The pixel data from the pixels in sensor array 302 may represent an image of an object or a scene.

In some embodiments, sensor array 302 may include peripheral circuits (e.g., peripheral circuitry 214), such as a row decoder and driver circuit and a column decoder and driver circuit at the boundary of the array of pixels for selectively activating one or more pixels (e.g., a row of pixels) to read the current or voltage signals. In some implementations, an array of analog-to-digital convertors each corresponding to a column of pixels may be used to convert the current or voltage signals from each row of pixels to digital pixel data. In some implementations, the peripheral circuits may include local memory for temporally storing analog or digital data. In some implementations, sensor array 302 may include an address event representation (AER) image sensor, where the peripheral circuits may include timing, control, and support circuits, address encoder circuits, and reference generator circuit. In an AER image sensor, each pixel may include an integrator for integrating the converted voltage or current signal, and a comparator for comparing the integrated voltage or current signal with a reference level. When the integrated signal is greater than the reference level, an event signal, such as a spike or a digital pulse, may be generated by the pixel and sent to the address encoder, which may encode the address of the pixel that generates the event signal. A processor may receive the sequence of address data with embedded timing information, decode the address data, and duplicate the events or generate an image.

In some embodiments, sensor array 302 may include a CMOS sensor array. A CMOS image sensor is an integrated circuit for electronically capturing images using APS technology. Unlike CCD image sensors, CMOS sensors are produced using mainstream microelectronic fabrication processes. Advantages of the CMOS APS technology include low cost, small size, and the ability to integrate a significant amount of Very-Large-Scale-Integrated (VLSI) electronics on-chip. In a CMOS APS device, each pixel of the image sensor array may have both a photodetector and an active transistor circuitry for reading the output signal from the photodetector on the pixel. The photodetector for each pixel in the image sensor array may convert photons incident on the pixel to electric charge via the photoelectric effect. The charge may be integrated over a period of time that is long enough to collect a detectable amount of charge, but short enough to avoid saturating the storage elements. This period of time for the charge integration is analogous to a film exposure time (i.e., the shutter speed) and may also be referred to as an integration time. In the image sensor array of the CMOS APS device, the integration time may be the time between a reset of a given row and a subsequent read of the row. The photodetectors in the image sensor array may be sensitive to light in a narrow wavelength band, or may be broadband photodetectors that are sensitive to light in a broad wavelength band (e.g., including visible, NIR, SWIR, etc.). Many different types of photodetectors may be used for the image sensor array.

Image sensor 300 may further includes a processor 320 (e.g., microprocessor 216) coupled to (e.g., bonded to or integrated into the chip of) sensor array 302 and configured to receive and process the pixel data generated by sensor array 302 for various applications as described above. In some embodiments, all or part of the peripheral circuits described above may be integrated into the chip that includes processor 320. Processor 320 can execute an imaging application to construct an image based on the pixel data. As described above with respect to FIGS. 1 and 2, processor 320 may also execute one or more CV applications, one or more machine learning applications, and the like, to analyze the image for various other applications, such as object detection and identification, sensing and ranging, liveness detection, user authentication, bar code or QR code reading, and the like. In some examples, sensor array 302 and processor 320 may be monolithically integrated into a same chip on a same substrate, or may be housed in a same package.

To reduce the horizontal footprint (e.g., on the x-y plane) of image sensor 300, sensor array 302 and processor 320 (as well as cover glass 312) may be arranged in a vertical stack (e.g., along the z-axis). Image sensor 300 may include a circuit board 330, on which the stack that includes sensor array 302, processor 320, and cover glass 312 may be mounted. Circuit board 330 may include a printed circuit board (PCB) and may provide electrical connections to sensor array 302 and processor 320. For example, processor 320 may include flip-chip connectors (e.g., flip-chip connectors 332), bond wires, and the like, which can be soldered onto pads 334 of circuit board 330. Image sensor 300 may also include bond wires 336a and 336b that are soldered onto pads 338a and 338b of circuit board 330 and bonding pads on sensor array 302 to provide electrical connections between sensor array 302 and circuit board 330. Circuit board 330 can include circuits to provide electrical connections between pads 334 and 338 to enable communication between sensor array 302 and processor 320. Cover 304 can be mounted on circuit board 330 to enclose and house sensor array 302 and processor 320 to form a package of image sensor 300. Circuit board 330 may include connectors 340 to provide electrical connections between image sensor 300 and other components of the mobile device, such as the main processor (e.g., main processor 220) of the mobile device and the power supply (e.g., battery) on the mobile device.

As shown in FIG. 3, image sensor 300 may have an FOV 350 for imaging. FOV 350 can have an angle of θ around an optical axis 360 perpendicular to circuit board 330. In the example shown in FIG. 3, optical axis 360 aligns with, for example, the z-axis when circuit board 330 is parallel with x-y plane. FOV 350 may be determined based on both the properties (e.g., focal length) of lens 308 and the dimensions of surface 314 of sensor array 302. For a given size of sensor array 302, the shorter the focal length of lens 308, the wider the angular field of lens 308 and image sensor 300. For example, if the focal length of lens 308 is f and surface 314 has a dimension h on the horizontal plane (e.g., x-y plane), the FOV angle θ on the horizontal plane can be approximately determined by $$\theta = 2\arctan\left(\frac{h}{2f}\right).$$

The focal length f of lens 308 may be, for example, less than 25 mm, less than 20 mm, less than 10 mm, or less than 5 mm.

The FOV can be defined on different planes. For example, FOV angle θ can be a horizontal FOV (HFOV) in the x-z plane that can be determined based on the horizontal dimension of sensor array 302 (e.g., in the x direction), a vertical FOV (VFOV) in the y-z plane that can be determined based on the vertical dimension of sensor array 302 (e.g., in the y direction), or a diagonal FOV (DFOV) that can be determined based on a diagonal dimension of sensor array 302 in the x-y plane.

As described above, in some embodiments, image sensor 300 may be used as a part of an eye-tracking system in a near-eye display system, such as some VR/AR display systems, for determining an eye's position (including, e.g., orientation and location of the eye) and gaze direction in order to display appropriate content from appropriate perspectives to user's eyes. An eye-tracking system may include one or more light sources (e.g., light emitting diodes) configured to emit light (e.g., visible light or infrared light) to illuminate user's eyes. The eye-tracking system may also include one or more cameras or other images sensors configured to capture light reflected by user's eyes to form one or more images of the user's eyes. Image sensor 300 may be used as a camera for eye tracking.

In addition to eye-tracking, image sensor 300 may be used to capture images of the irises of the user's eyes, which may have complex and stable features that can be used, for example, for biometric authentication. As described above, for eyes with different iris colors, the quality of the images captured using light in different wavelength bands (e.g., visible wavelength band, NIR band, SWIR band, etc.) may be different. For example, for dark brown irises, images captured using visible light may appear dark and may reveal less visible texture, while images captured using NIR light may reveal rich features. Using the NIR spectrum may also enable the blocking of corneal specular reflections in a bright ambient environment and allow only NIR light from a narrow-band illuminator to reach the image sensor. However, for blue irises, imaging using visible light may reveal rich iris features, while images captured using NIR light may appear dark. Therefore, to capture eye features for a large population, eye tracking using both visible light and IR light may be desired.

Figure 4:
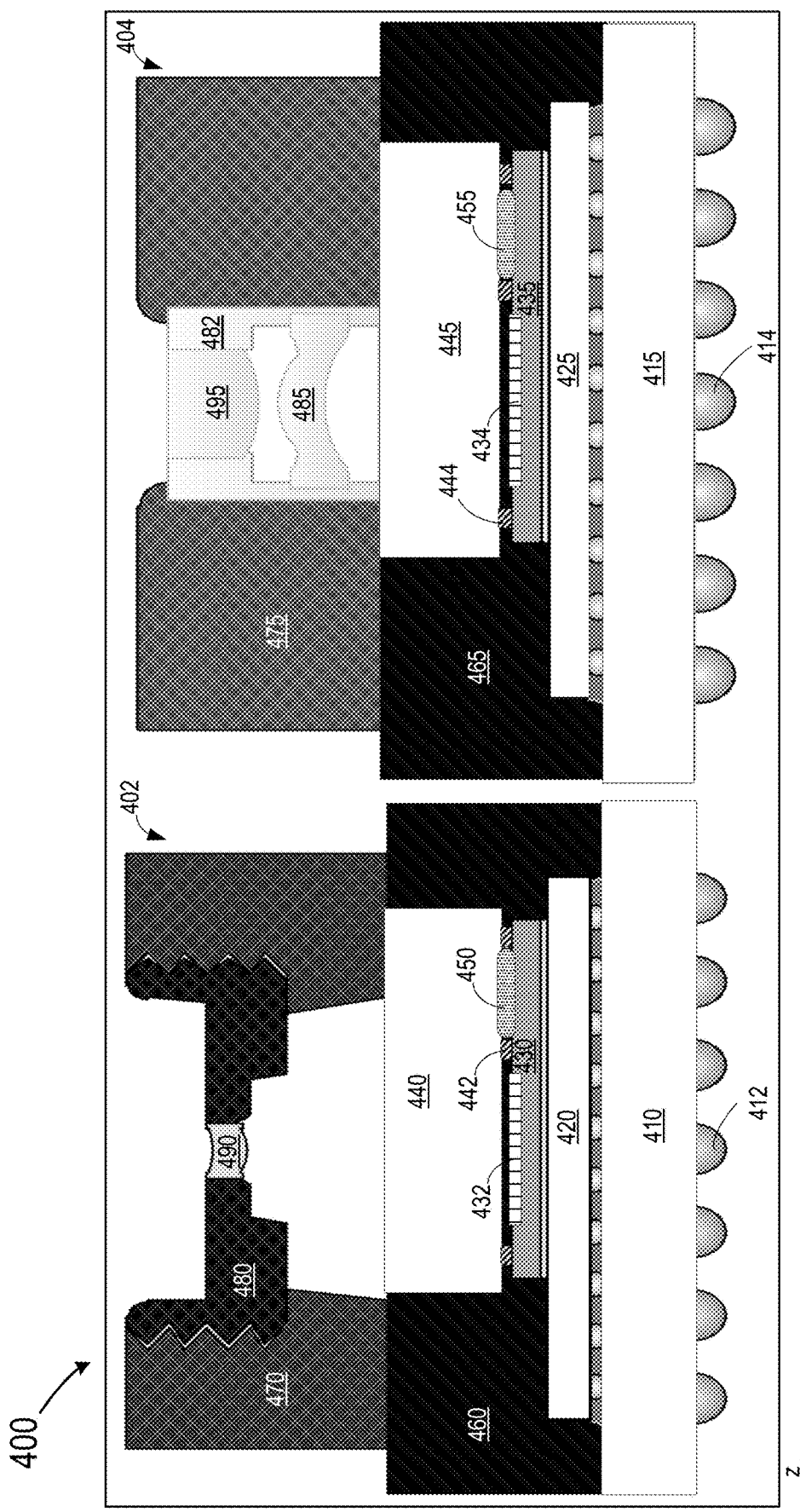
FIG. 4 illustrates an example of a system that includes two separate image sensor devices for capturing two images of an object.

In general, two or more image sensors 300 may be used in a system to capture features of irises of any color. For example, visible light (e.g., between about 400 nm and about 750 nm) sensors may be used to capture detailed features of blue irises, while near-infrared (e.g., between about 750 nm and about 1000 nm) sensors may capture high-quality iris images for brown irises. Existing techniques may use two or more separate image sensor devices in separate packages to captures multiple iris images using light in different wavelength bands, where each image sensor device may include a lens assembly, an image sensor die, and a processing unit in a respective package. For each wavelength range (e.g., visible, NIR, SWIR, etc.), a separate image sensor device (in a separate package) may need to be used. Including multiple image sensor devices in a near-eye display system may increase the physical dimension, cost, and power consumption of the system. Hyperspectral imaging techniques may be used for imaging in multiple wavelength bands. However, hyperspectral imaging cameras are generally expensive and bulky, and thus may not be suitable for use in compact, mobile systems such as near-eye display systems or other AR/VR systems FIG. 4 illustrates an example of a system 400 that includes two separate image sensor devices 402 and 404 for capturing two images of an object, such as an eye of a person. In some embodiments, image sensor device 402 and image sensor device 404 may have the same structure, but may have arrays of sensor pixels that are sensitive to light in different wavelength bands or may include wideband photosensors and different filters (e.g., bandpass, low-pass, or high-pass filters) In some embodiments, image sensor device 402 and image sensor device 404 may have different structures and/or components. Image sensor device 402 and image sensor device 404 may be bonded (e.g., soldered) onto a same PCB board (e.g., a mother board or another electrical backplane, not shown in FIG. 4).

In the illustrated example, image sensor device 402 may include a circuit board 410 (e.g., a PCB), which may be similar to circuit board 330 described above. Circuit board 410 may include connectors 412 (e.g., solder balls) at one side, for example, for soldering to a larger PCB board (e.g., the mother board or electrical backplane). Circuit board 410 may also include connectors (e.g., bonding pads) on the other side. A processor 420 (e.g., including a controller or a driver circuit) may be bonded to the bonding pads on circuit board 410. A sensor array 430 may be physically bonded to processor 420, for example, using an epoxy, and may be electrically bonded to circuit board 410 or processor 420, for example, using bonding wires. Sensor array 430 may include a two-dimensional array of sensor pixels 432. As described above, sensor pixels 432 may include narrow-band or broadband photodetectors. A cover glass 440 may be positioned on top of sensor array 430 to protect sensor array 430. In regions where sensor pixels 432 are located, there may be a spacer 442 between sensor array 430 and cover glass 440. In other regions of sensor array 430, sensor array 430 and cover glass 440 may be bonded together by a bonding material 450 (e.g., glue or epoxy).

An encapsulation structure 460 may then be formed on the layer stack including circuit board 410, processor 420, sensor array 430, and cover glass 440 using, for example, a mold compound in an overmolding process. Encapsulation structure 460 may surround the layer stack and may fill some gaps in the layer stack, but may not fill the gap between sensor array 430 and cover glass 440 formed by spacer 442. Encapsulation structure 460 may not cover at least a portion of cover glass 440 such that external light can reach sensor array 430 through cover glass 440. The mold compound forming encapsulation structure 460 may include, for example, a plastic material, a dielectric material, an organic material, and the like, such as epoxy resins containing inorganic fillers (e.g., fused silica), catalysts, flame retardants, stress modifiers, adhesion promoters, and other additives.

A package top cover 470 may then be bonded or molded onto the layer stack and encapsulation structure 460. Both encapsulation structure 460 and package top cover 470 may be opaque and thus may block stray light and/or ambient light from reaching sensor array 430. Package top cover 470 may include an aperture where a lens assembly that includes a lens holder 480 and an optical lens 490 may be seated. In the illustrated example, package top cover 470 and lens holder 480 may include matching threads, such that lens holder 480 may be fastened into the aperture of package top cover 470. Optical lens 490 may be a small lens, such as a lens with a diameter less than about 2 mm or less than about 1 mm (e.g., between about 0.1 mm and about 1 mm). The array of sensor pixels 432 may also have a small size, such as less than about $2 \times 2$ mm$^2$ or less than about $1 \times 1$ mm$^2$ (e.g., between about 0.5×0.5 mm² and about 1×1 mm²). The array of sensor pixels 432 may be sensitive to, for example, visible light, NIR light, SWIR light, and the like.

In the illustrated example, image sensor device 404 may include a circuit board 415 (e.g., a PCB), which may be similar to circuit board 330 or 410 described above. Circuit board 415 may include connectors 414 (e.g., solder balls) at one side (e.g., the bottom side), for example, for soldering to a mother board or an electrical backplane. Circuit board 415 may also include connectors (e.g., bonding pads) on the other side (e.g., the top side). A processor 425 may be bonded to the bonding pads on circuit board 415. A sensor array 435 may be physically bonded to processor 425, for example, using an epoxy, and may be electrically bonded to processor 425 directly or through circuit board 415, for example, using bonding wires. Sensor array 435 may include a two-dimensional array of sensor pixels 434. Sensor pixels 434 may include narrow-band or broadband photodetectors. A cover glass 445 may be attached to sensor array 435 to protect sensor array 435. In regions where the sensor pixels 434 are located, there may be a spacer 444 between sensor array 435 and cover glass 445. In other regions of sensor array 435, sensor array 435 and cover glass 445 may be bonded together by a bonding material 455 (e.g., glue or epoxy).

An encapsulation structure 465 may then be formed on the layer stack including circuit board 415, processor 425, sensor array 435, and cover glass 445 using, for example, a mold compound in an overmolding process. Encapsulation structure 465 may surround the layer stack and may fill some gaps in the layer stack, but may not fill the gap between sensor array 435 and cover glass 445 formed by spacer 444. Encapsulation structure 465 may not cover at least a portion of cover glass 445 such that external light can reach sensor array 435 through cover glass 445. The mold compound forming encapsulation structure 460 may include, for example, a plastic material, a dielectric material, an organic material, and the like, such as epoxy resins containing inorganic fillers (e.g., fused silica), catalysts, flame retardants, stress modifiers, adhesion promoters, and other additives.

A cover 475 may then be bonded or molded onto the layer stack and encapsulation structure 465. Both encapsulation structure 465 and cover 475 may be opaque and thus may block stray light and/or ambient light from reaching sensor array 435. Cover 475 may include an aperture where a lens assembly that includes a lens holder 482, a first lens 485, and a second lens 495 may be seated. In the illustrated example, first lens 485 and second lens 495 may be assembled (e.g., glued or molded) with lens holder 482 to form the lens assembly, and cover 475 may be overmolded with the lens assembly. In some embodiments, first lens 485 and second lens 495 may be molded with cover 475, without using a lens holder. First lens 485 and second lens 495 may be small lenses, such as lenses with a diameter less than about 2 mm or less than about 1 mm (e.g., between about 0.1 mm and 1 mm). The array of sensor pixels 434 may also have a small size, such as less than about 2×2 mm² or less than about 1×1 mm² (e.g., between about 0.5×0.5 mm² and about 1×1 mm²). The array of sensor pixels 434 may be sensitive to, for example, visible light, NIR light, SWIR light, and the like.

In the example illustrated in FIG. 4, the two image sensor devices 402 and 404 may be in separate packages that each include a lens assembly, a cover glass, a sensor array, a processor, and a printed circuit board. The two packages may need to be fabricated individually and then bonded to an electrical backplane, which may increase the size and cost of system 400. Furthermore, more bonding pads and a large area may be needed on the electrical backplane to bond with the two packages. In addition, the two image sensor devices may image the target object (e.g., an eye) from different perspectives due to the relatively large physical separation of the two packages. Moreover, the two processors may consume more power than a single processor.

According to certain embodiments, an image sensor device may include two or more image sensor arrays and a low-power processor in a same package for capturing two or more images of an object, such as an eye of a user. The two or more image sensor arrays may have different working wavelength ranges or may have a wide working wavelength range that covers multiple wavelength bands, and thus may capture images using light in different wavelength ranges, such as visible light, NIR light, SWIR light, and the like. The low-power processor may control and manage the two image sensor arrays, and/or may process the image data captured by the two image sensor arrays. One or more lens assemblies may be used to form an image of the object on each of the two or more image sensor arrays.

In some embodiments, two or more separate lens assemblies may be used, where each lens assembly may be designed and optimized for a different respective wavelength range. In some embodiments, each lens assembly may be configured to have different fields of view, different focal lengths and thus different magnifications, different focal plane distances, different heights, and the like. In some embodiments, one lens assembly may be used to project imaging light onto the two image sensor arrays through a beam splitter (e.g., a prism), where the imaging light may be split by the beam splitter into two beams that each reach a respective image sensor array. One or more filters may be used to select light from the multiple wavelength bands for imaging by the respective image sensor array.

Main components of the device can be integrated into a single package, for example, using overmolding technique. The lens assemblies and the image sensor arrays can have very small sizes, such as having a linear dimension less than about 2 mm, less than about 1 mm, or less than about 0.5 mm. Therefore, the physical dimension of the package can be small, such that it can be easier to integrate the package into a compact, mobile system, such as a pair of AR/VR glasses. Thus, techniques disclosed herein can achieve multi-wavelength imaging of an object using a single image sensor device in a single robust package that has a small form factor. The power consumption may also be reduced due to the use of the single low-power processor for controlling and managing the two image sensor arrays and for data processing. Therefore, image sensor devices disclosed herein are particularly suitable for use in mobile devices or wearable devices, such as near-eye display systems for AR/VR applications.

Figure 5:
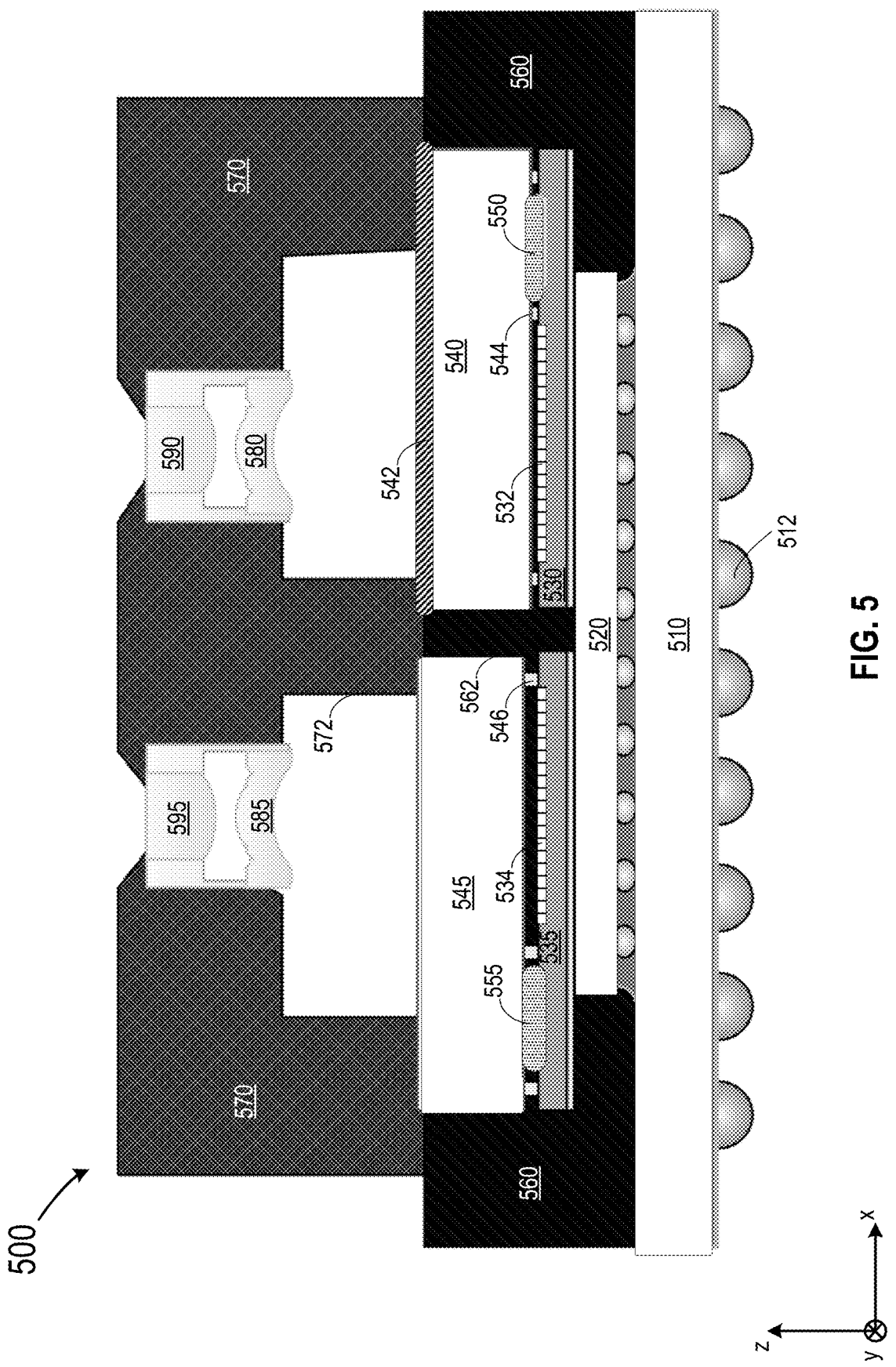
FIG. 5 illustrates an example of an image sensor device that includes two image sensor arrays and a processor in a same package for capturing two images of an object according to certain embodiments.

FIG. 5 illustrates an example of an image sensor device 500 that includes two image sensor arrays and a processor in a same package for capturing two images of an object according to certain embodiments. In the illustrated example, image sensor device 500 may include a circuit board 510 (e.g., a PCB), which may be similar to circuit board 330 or 410 described above. Circuit board 510 may include connectors 512 (e.g., solder balls) at one side (e.g., the bottom side), for example, for soldering to a mother board or an electrical backplane. Circuit board 510 may also include connectors (e.g., bonding pads) on the other side (e.g., the top side). A processor 520 may be bonded to the bonding pads on circuit board 510. Two sensor arrays 530 and 535 may be physically bonded to different regions of processor 520 using, for example, an epoxy, and may be electrically bonded to circuit board 510 and/or processor 520 using, for example, bonding wires.

Sensor array 530 may include a two-dimensional array of sensor pixels 532 that may be sensitive to, for example, visible light, NIR light, and/or SWIR light. A cover glass 540 may be attached to sensor array 530 to protect sensor array 530. In regions where sensor pixels 532 are located, there may be a spacer 544 between sensor array 530 and cover glass 540. In other regions of sensor array 530, sensor array 530 and cover glass 540 may be bonded together by a bonding material 550 (e.g., glue or epoxy). A filter 542 may be formed on a surface (e.g., top surface in the illustrated example) of cover glass 540. Filter 542 may block visible light and may allow NIR or SWIR light to pass through. For example, filter 542 may include an NIR bandpass filter or a high-pass filter that may allow light with longer wavelengths (e.g., >700 or 750 nm) to pass through. In one example, filter 542 may include a material that absorbs light having shorter wavelengths but may allow light having longer wavelengths to pass through. In another example, filter 542 may include multiple dielectric thin films that collectively reflect visible light and transmit IR light.

Sensor array 535 may also include a two-dimensional array of sensor pixels 534 that may be sensitive to, for example, visible light, NIR light, and/or SWIR light. A cover glass 545 may be attached to sensor array 535 to protect sensor array 535. In regions where sensor pixels 534 are located, there may be a spacer 546 between sensor array 535 and cover glass 545. In other regions of sensor array 535, sensor array 535 and cover glass 545 may be bonded together by a bonding material 555 (e.g., glue or epoxy). The arrays of sensor pixels 532 and 534 may each have a small size, such as less than about 2×2 mm$^2$ or less than about 1×1 mm$^2$ (e.g., about 0.5×0.5 mm$^2$). In some embodiments, sensor array 530 and sensor array 535 may be on two different regions of a same die.

An encapsulation structure 560 may then be formed on the layer stack including circuit board 510, processor 520, sensor arrays 530 and 535, cover glasses 540 and 545, and filter 542 using, for example, a mold compound in an overmolding process. Encapsulation structure 560 may surround the layer stack and may fill some gaps in the layer stack, such as the gap between sensor arrays 530 and 535 and the gap between cover glass 540 and cover glass 545, but may not fill the gap between sensor array 530 and cover glass 540 formed by spacer 544 or the gap between sensor array 535 and cover glass 545 formed by spacer 546. Encapsulation structure 560 may not cover at least a portion of cover glass 540 and at least a portion of cover glass 545, such that external light can reach sensor arrays 530 and 535 through cover glasses 540 and 545, respectively. Encapsulation structure 560 may include, for example, a plastic material, a dielectric material, an organic material, and the like. In one example, the mold compound may include epoxy resins containing inorganic fillers (e.g., fused silica), catalysts, flame retardants, stress modifiers, adhesion promoters, and other additives. Encapsulation structure 560 may include a region 562 between sensor array 530/cover glass 540 and sensor array 535/cover glass 545. Region 562 of encapsulation structure 560 may isolate the two sensor arrays to prevent stray light or ghost images.

A package top cover 570 may then be bonded or molded onto the layer stack and encapsulation structure 560. Both encapsulation structure 560 and package top cover 570 may be opaque and thus may prevent stray light and/or ambient light from reaching sensor arrays 530 and 535. Package top cover 570 may include two apertures where two lens assemblies may be seated. In the illustrated example, the first lens assembly may include a lens holder that holds a first lens 580 and a second lens 590, and the second lens assembly may include a lens holder that hold a first lens 585 and a second lens 595. In the illustrated example, first lens 580 and second lens 590 may be assembled (e.g., glued or molded) with the corresponding lens holder to form the first lens assembly, first lens 585 and second lens 595 may be assembled (e.g., glued or molded) with the corresponding lens holder to form the second lens assembly, and cover 575 may be overmolded with the first lens assembly and the second lens assembly. In some embodiments, the lenses may be molded in place with package top cover 570, without using a lens holder.

In some embodiments, lenses 580, 590, 585, and 595 may be small lenses, such as lenses with a diameter less than about 2 mm or less than about 1 mm (e.g., between about 0.1 mm and about 1 mm). A region 572 of package top cover 570 may be aligned with region 562 of encapsulation structure 560 to optically isolate the two lens assemblies and the corresponding sensor arrays 530 and 535. In some embodiments, the distance between first lens 580 and filter 542 may be between about 0.4 mm and about 2 mm. As described above, each lens assembly may be designed and optimized for a different respective wavelength range. In some embodiments, the two lens assemblies may be configured to have different fields of view, different focal lengths and thus different magnifications, different focal plane distances, different heights, and the like, such that the images formed in the sensor arrays can be in best focus.

It is noted that FIG. 5 is not drawn to scale. In addition, in some embodiments, each lens assembly may include one lenses, two lenses, or more than two lenses in a lens group. The lenses may include spherical lenses, aspheric lenses, free-form lenses, and any other types of lens, and may be made using plastic, glass, or any other suitable materials. In some embodiments, image sensor device 500 may include more than two sensor arrays, such as three or four sensor arrays arranged according to a pattern. Due to the integration of two or more sensor arrays into a same package, the use of one processor to control or manage the two or more sensor arrays and to process data from the two or more sensor arrays, and the use of overmolding techniques to integrate the components into the same package, the size, cost, and power consumption of image sensor device 500 may be much lower than the overall size, cost, and power consumption of image sensor device 402 and image sensor device 404 in system 400.

Figure 6:
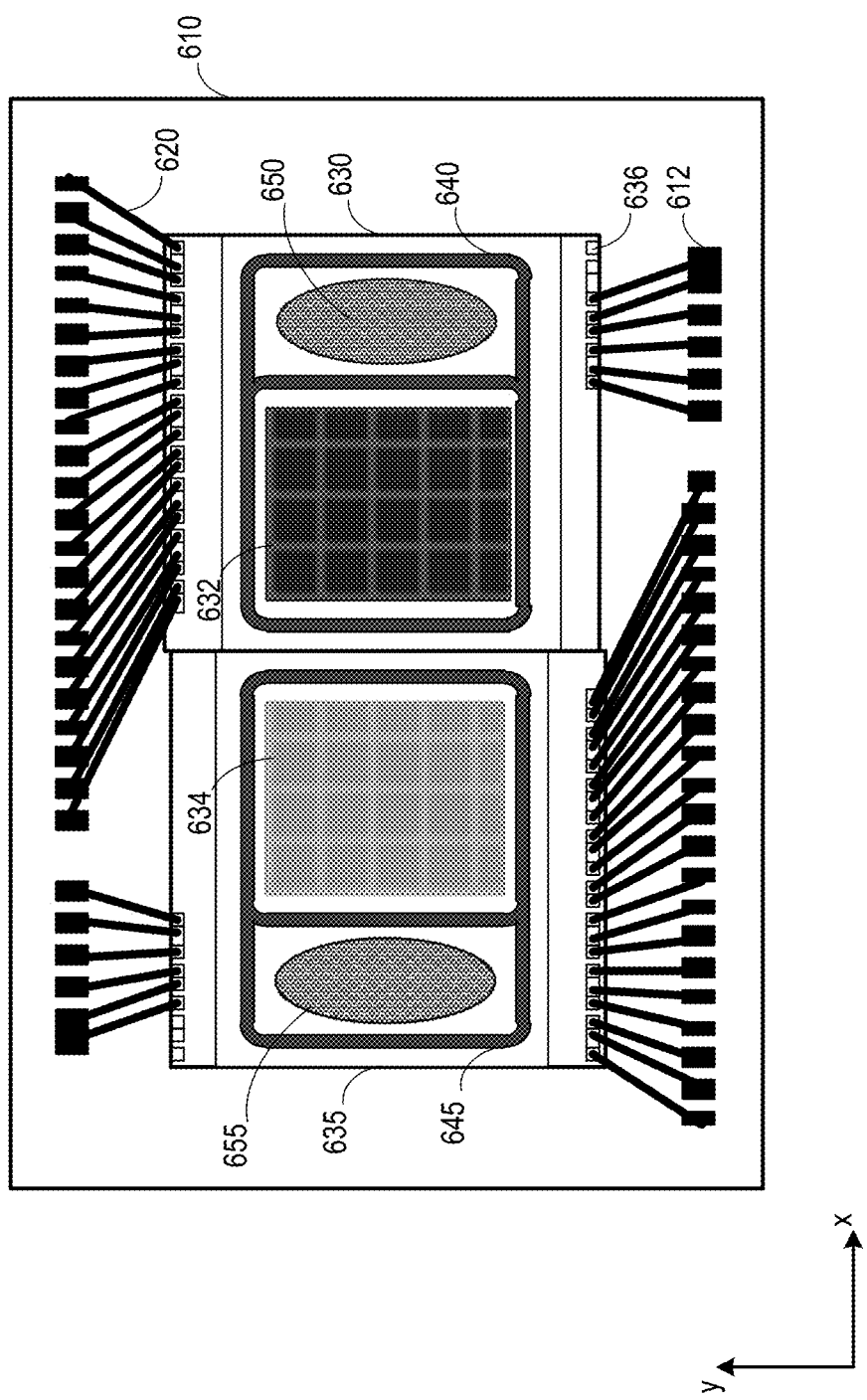
FIG. 6 illustrates an example of an image sensor including two sensor arrays for capturing two images of an object according to certain embodiments.

FIG. 6 illustrates an example of an image sensor including two sensor arrays 630 and 635 bonded to a circuit board 610 for capturing two images of an object according to certain embodiments. The example of the image sensor shown in FIG. 6 may be a top view of a portion of image sensor device 500. As described above with respect to FIG. 5, sensor arrays 630 and 635 may include an array of sensor pixels 632 and an array of sensor pixels 634, respectively. Regions 650 and 655 on sensor arrays 630 and 635, respectively, may be used to bond sensor arrays 630 and 635 to the corresponding cover glasses (e.g., cover glasses 540 and 542). Sensor arrays 630 and 635 may include bonding pads 636 (or solder balls), for example, at the periphery of sensor arrays 630 and 635. Circuit board 610 may also include bonding pads 612. Sensor arrays 630 and 635 may be bonded to circuit board 610 through bonding wires 620 and bonding pads 612 and 636. In some embodiments, circuit board 610 may be an example of circuit board 510, and a processor (e.g., processor 520, not shown in FIG. 6) may be between circuit board 610 and sensor arrays 630 and 650, where the processor may be electrically connected to bonding pads 612 through circuits in circuit board 610. In some embodiments, a processor, rather than circuit board 610, may be used to electrically bond with sensor arrays 630 and 635. FIG. 6 also shows spacers 640 and 645 for form air gaps between sensor arrays 630 and 635 and the corresponding cover glasses.

Figure 7:
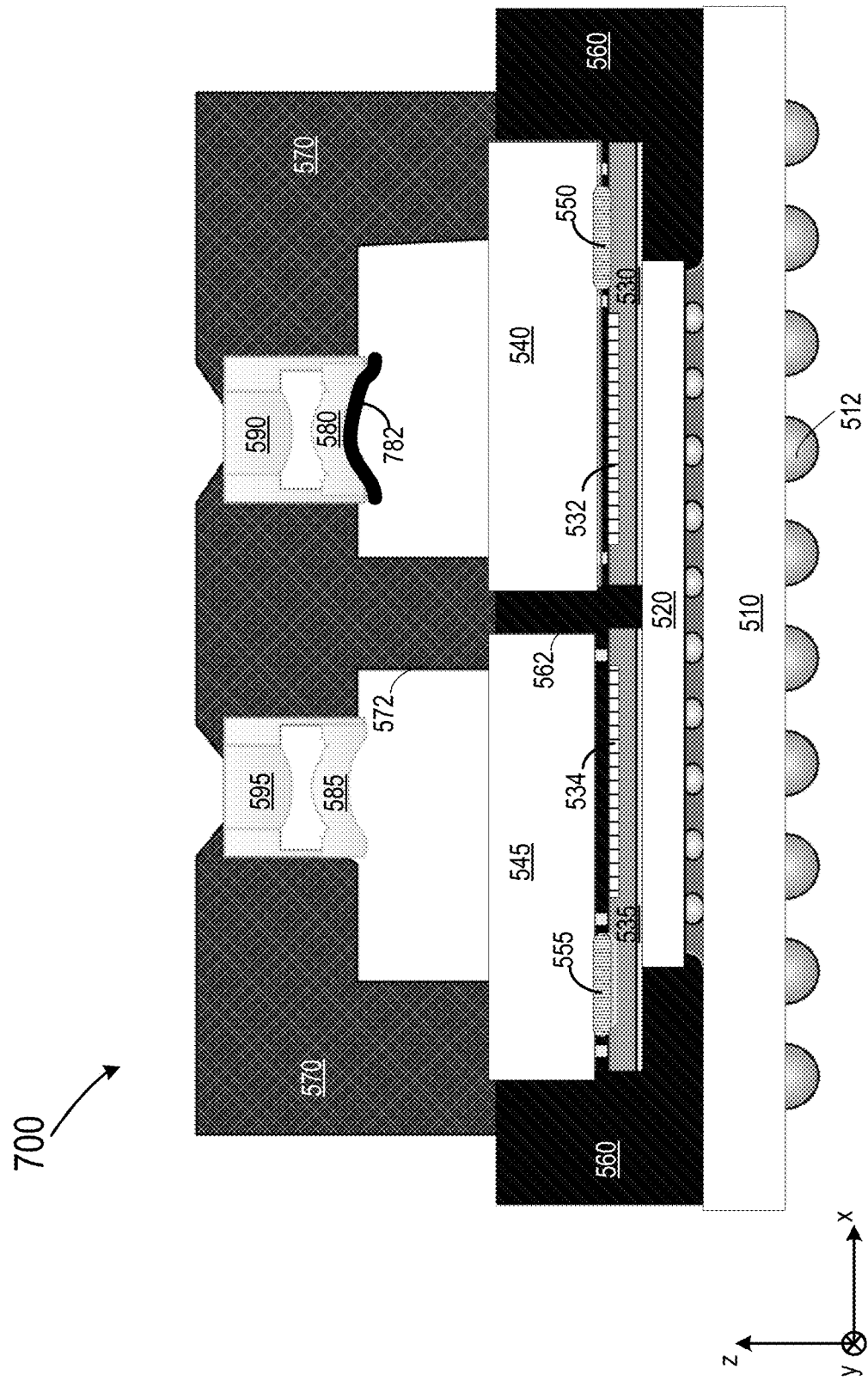
FIG. 7 illustrates another example of an image sensor device that includes two image sensor arrays and a processor in a same package for capturing two images of an object according to certain embodiments.

FIG. 7 illustrates another example of an image sensor device 700 that includes two image sensor arrays and a processor in a same package for capturing two images of an object according to certain embodiments. Image sensor device 700 may be similar to image sensor device 500, but may have a filter for blocking (e.g., absorbing or reflecting) visible light at a different location. For example, as illustrated, a filter 782 for blocking visible light and transmitting NIR or SWIR light may be coated on a surface of first lens 580 in the first lens assembly, rather than on a surface of cover glass 540 (on the top surface of cover glass 540 as shown in FIG. 5).

Figure 8:
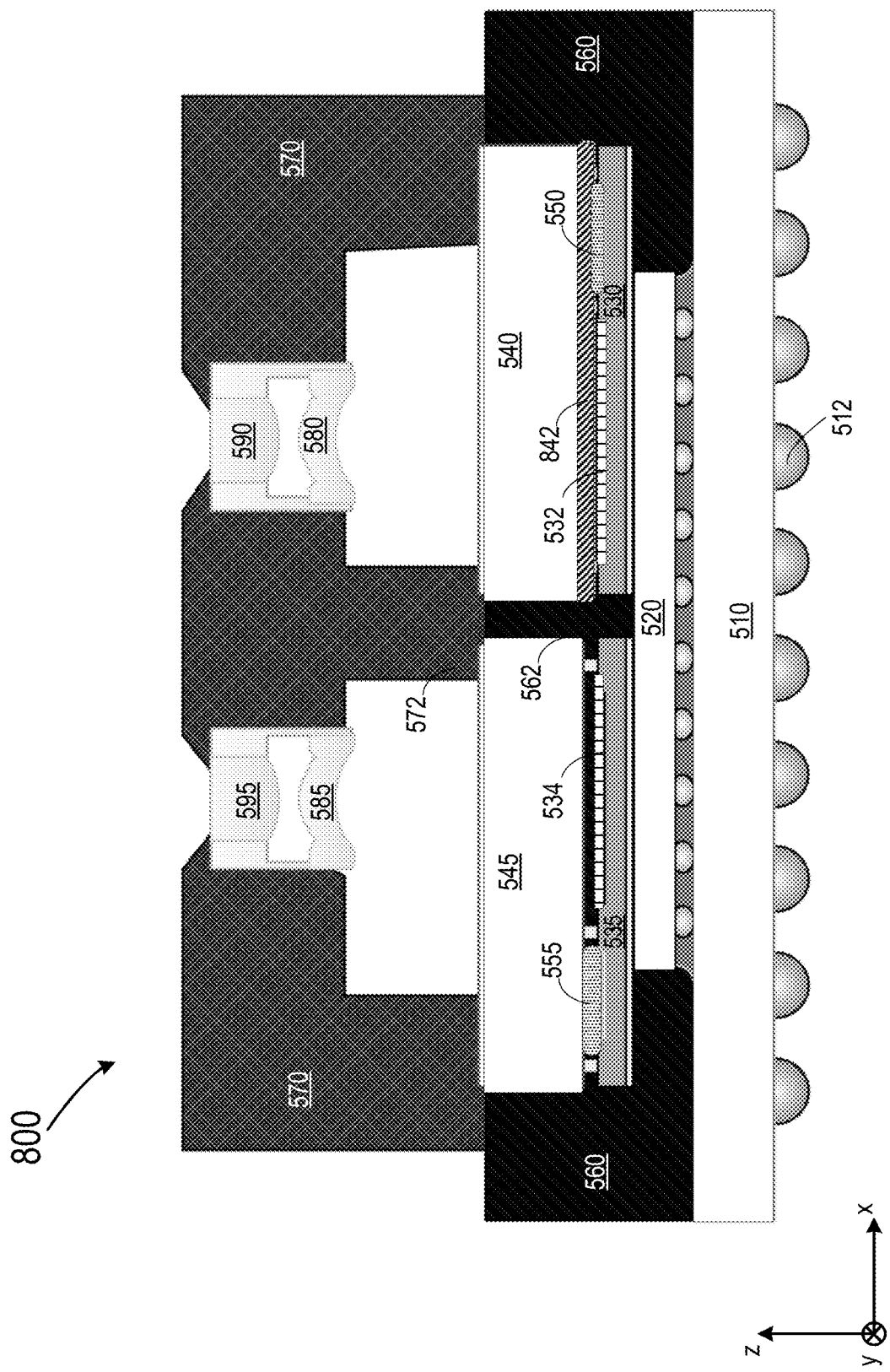
FIG. 8 illustrates another example of an image sensor device that includes two image sensor arrays and a processor in a same package for capturing two images of an object according to certain embodiments.

FIG. 8 illustrates another example of an image sensor device 800 that includes two image sensor arrays and a processor in a same package for capturing two images of an object according to certain embodiments. Image sensor device 800 may be similar to image sensor devices 500 and 700, but may have a filter for blocking (e.g., absorbing or reflecting) visible light at a different location. For example, as illustrated, a filter 842 for blocking visible light and transmitting NIR or SWIR light may be coated on a bottom surface of cover glass 540, rather than on the top surface of cover glass 540 as shown in FIG. 5 or on a surface of lens 580 as shown in FIG. 7.

Figure 9:
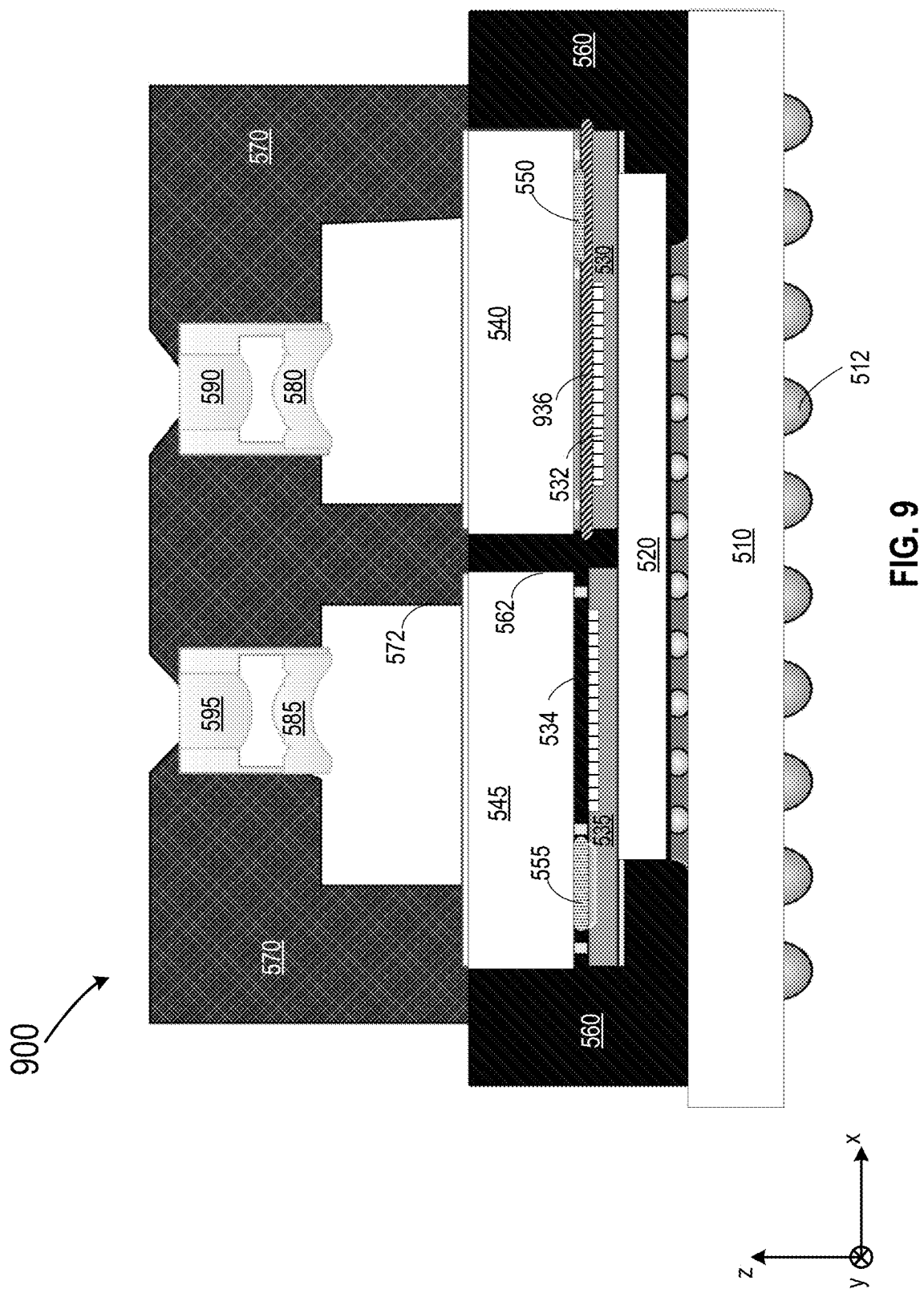
FIG. 9 illustrates yet another example of an image sensor device including two image sensor arrays and a processor in a same package for capturing two images of an object according to certain embodiments.

FIG. 9 illustrates yet another example of an image sensor device 900 including two image sensor arrays and a processor in a same package for capturing two images of an object according to certain embodiments. Image sensor device 900 may be similar to image sensor devices 500, 700, and 800, but may have a filter for blocking (e.g., absorbing or reflecting) visible light at a different location. For example, as illustrated, a filter 936 for blocking visible light and transmitting NIR or SWIR light may be formed (e.g., attached or coated) on a top surface of sensor array 530, rather than on the top surface of cover glass 540 as shown in FIG. 5 and FIG. 8 or on a surface of lens 580 as shown in FIG. 7.

Even though not shown in FIGS. 5 and 7-9, in some embodiments, an IR cut-off filter may be formed on a surface of lens 585, cover glass 545, or sensor array 535 to block (e.g., absorb) IR light and transmit visible light, such that only visible light reflected by the object (e.g., an eye) may reach sensor array 535.

Figure 10:
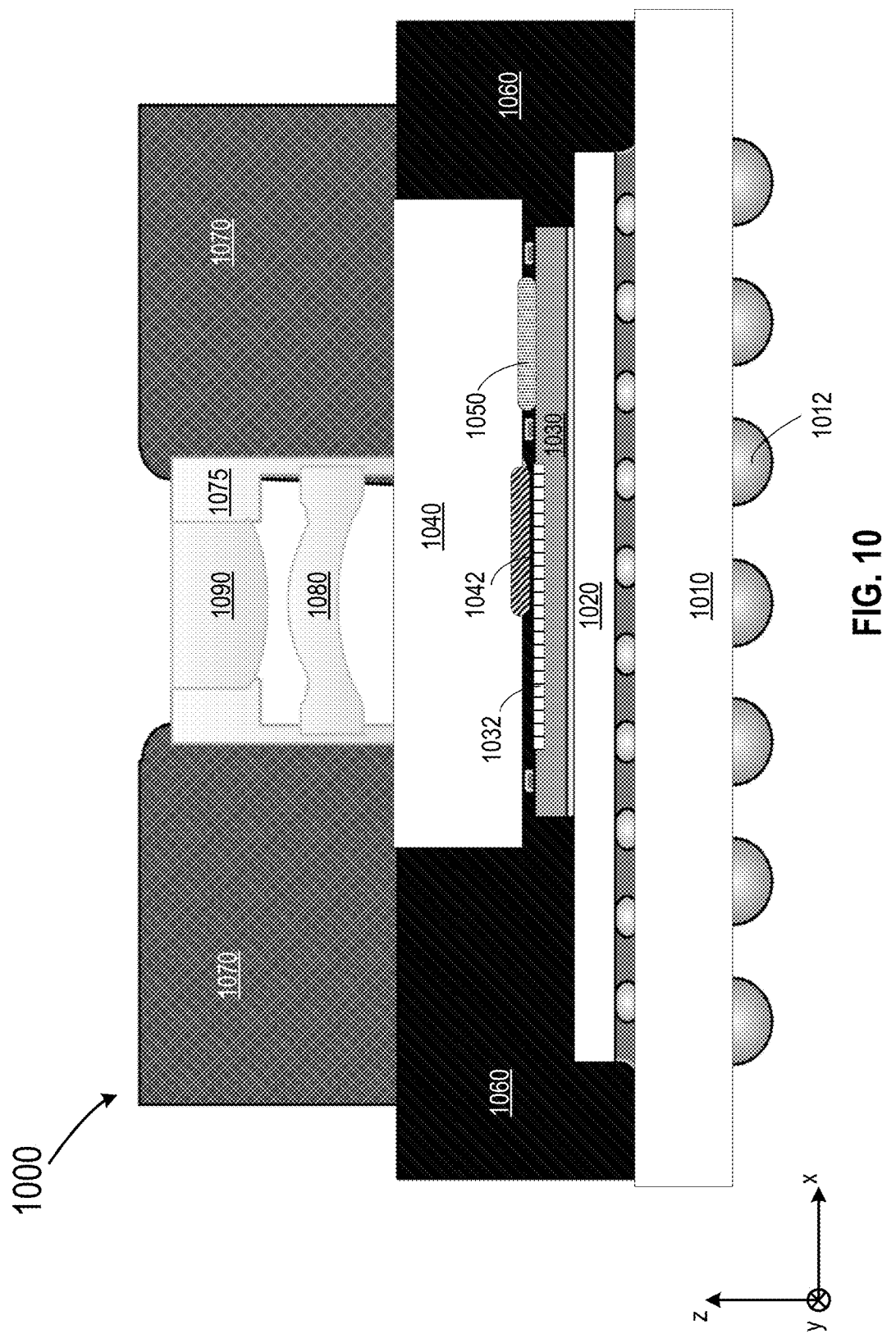
FIG. 10 illustrates an example of an image sensor device including one image sensor array and a processor in a package for capturing two images of an object according to certain embodiments.

FIG. 10 illustrates an example of an image sensor device 1000 including a sensor array 1030 and a processor 1020 in a same package for capturing two images of an object according to certain embodiments. In the illustrated example, image sensor device 1000 may include a circuit board 1010 (e.g., a PCB), which may be similar to circuit board 330 or 510 described above. Circuit board 1010 may include connectors 1012 (e.g., solder balls) at one side (e.g., the bottom side), for example, for soldering to a mother board or an electrical backplane. Circuit board 1010 may also include connectors (e.g., bonding pads) on the other side (e.g., the top side). A processor 1020 may be bonded to the bonding pads on circuit board 1010. A sensor array 1030 may be physically bonded to processor 1020 using, for example, an epoxy, and may be electrically bonded to circuit board 1010 and/or processor 1020 using, for example, bonding wires.

Sensor array 1030 may include a two-dimensional array of sensor pixels 1032 that may be sensitive to light in a broad band, such as visible light, NIR light, and SWIR light bands. The array of sensor pixels 1032 may have a small size, such as less than about 2×2 mm$^2$ or less than about 1×1 mm$^2$ (e.g., about 0.5×0.5 mm$^2$). A cover glass 1040 may be positioned on top of sensor array 1030 to protect sensor array 1030. In regions where sensor pixels 1032 are located, there may be a spacer between sensor array 1030 and cover glass 1040. In other regions of sensor array 1030, sensor array 1030 and cover glass 1040 may be bonded together by a bonding material 1050 (e.g., glue or epoxy). A filter 1042 may be formed on a portion of the top or bottom surface of cover glass 1040 or on top of a portion of sensor array 1030. Filter 1042 may block visible light and may allow NIR or SWIR light to pass through. For example, filter 1042 may include an NIR bandpass filter or a filter that may allow light with long wavelengths (e.g., >700 or 750 nm) to pass through. Thus, a portion (e.g., the left portion) of the array of sensor pixels 1032 may receive visible light and IR light (which may have a lower intensity than the visible light) to capture one image of the object, while another portion (e.g., the right portion) of the array of sensor pixels 1032 may receive the IR light only to capture another image of the object. In some embodiments, two filters may be coated on the bottom surface of cover glass 1040, where one filter (e.g., filter 1042) may block visible light and allow IR light to pass through, while the other filter may block IR light and allow visible light to pass through.

An encapsulation structure 1060 may then be formed on the layer stack including circuit board 1010, processor 1020, sensor array 1030, cover glass 1040, and filter 1042 using, for example, overmolding techniques. As described above, encapsulation structure 1060 may include, for example, a plastic material, a dielectric material, an organic material, or any other non-conductive opaque material, such as epoxy resins. Encapsulation structure 1060 may surround the layer stack and may fill some gaps in the layer stack, but may not fill the gap between sensor array 1030 and cover glass 1040 formed by the spacer. Encapsulation structure 1060 may not cover at least a portion of cover glass 1040 such that external light may reach sensor array 1030 through cover glass 1040.

A package top cover 1070 may be bonded or molded onto the layer stack and encapsulation structure 1060. Package top cover 1070 may be opaque and thus may block stray light and/or ambient light from reaching sensor array 1030. Package top cover 1070 may include an aperture where a lens assembly may be seated. In the illustrated example, the lens assembly may include a lens holder 1075 that holds a first lens 1080 and a second lens 1090. First lens 1080 and second lens 1090 may be assembled (e.g., glued or molded) with lens holder 1075 to form the lens assembly, and package top cover 1070 may be overmolded with the lens assembly. In some embodiments, lenses 1080 and 1090 may be molded in place with package top cover 1070 without using a lens holder. In some embodiments, lenses 1080 and 1090 may be small lenses, such as lenses with a diameter less than about 2 mm or less than about 1 mm (e.g., between about 0.1 mm and about 1 mm). In some embodiments, the distance between first lens 1080 and cover glass 1040 may be between about 0.4 mm and about 2 mm.

In the example shown in FIG. 10, visible and infrared light reflected by a target object (e.g., an eye) may be collected and projected onto sensor array 1030 by the lens assembly. A portion of the projected light may be filtered by filter 1042 to block visible light and transmit NIR or SWIR light, which may be captured by a portion of sensor array 1030 to form an image of the target object based on the NIR or SWIR light reflected by the target object. Another portion of the project light may not be filtered or may be filtered by another filter to block NIR or SWIR light and transmit visible light, which may be captured by another portion of sensor array 1030 to form another image of the target object based on the visible light reflected by the target object. In this way, two or more images of the target object may be captured using light in different wavelength bands, such that at least one of the images may reveal detailed features of the target object, such as the features of the iris of an eye with a brown iris or a blue iris. The two images may be processed by processor 1020 and/or may be sent to another processor outside of image sensor device 1000 for further processing, such as determining the position or gaze direction of the eye or authenticating a user.

Figure 11:
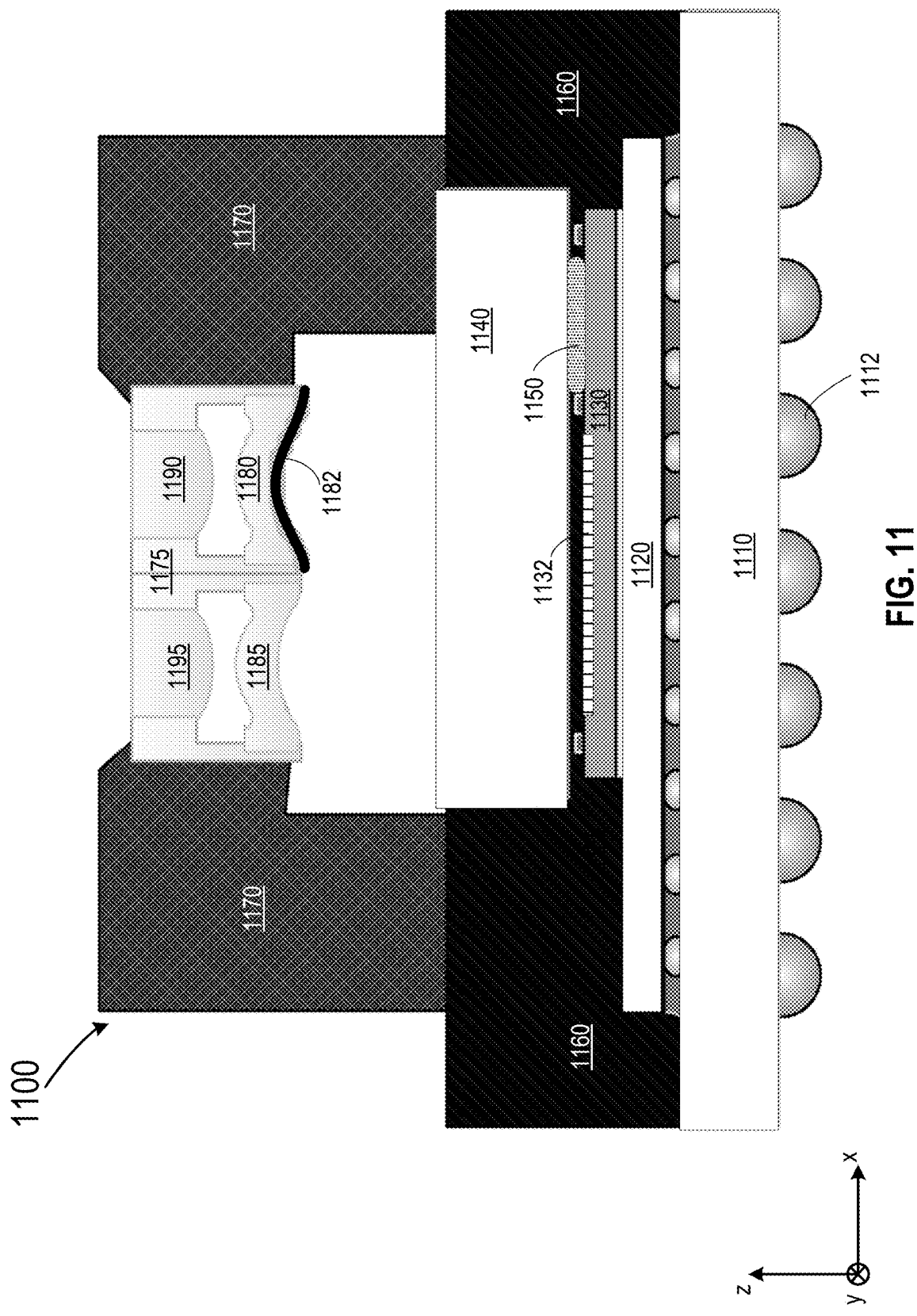
FIG. 11 illustrates another example of an image sensor device including one image sensor array and a processor in a package for capturing two images of an object according to certain embodiments.

FIG. 11 illustrates another example of an image sensor device 1100 including one image sensor array and a processor in a same package according to certain embodiments. In the illustrated example, image sensor device 1100 may include a circuit board 1110 (e.g., a PCB), which may be similar to circuit board 330, 510, or 1010 described above. Circuit board 1110 may include connectors 1112 (e.g., solder balls) at one side (e.g., the bottom side), for example, for soldering to a mother board or an electrical backplane. Circuit board 1110 may also include connectors (e.g., bonding pads) on the other side (e.g., the top side). A processor 1120 may be bonded to the bonding pads on circuit board 1110. A sensor array 1130 may be physically bonded to processor 1120 using, for example, an epoxy, and may be electrically bonded to circuit board 1110 and/or processor 1120 using, for example, bonding wires.

Sensor array 1130 may include a two-dimensional array of sensor pixels 1132 that may be sensitive to light in a broad band, such as the visible light, NIR light, and SWIR light bands. The array of sensor pixels 1132 may have a small size, such as less than about $2 \times 2$ mm$^2$ or less than about $1 \times 1$ mm$^2$ (e.g., about $0.5 \times 0.5$ mm$^2$). A cover glass 1140 may be placed on sensor array 1130 to protect sensor array 1130. In regions where sensor pixels 1132 are located, there may be a spacer between sensor array 1130 and cover glass 1140. In other regions of sensor array 1130, sensor array 1130 and cover glass 1140 may be bonded together by a bonding material 1150 (e.g., glue or epoxy).

An encapsulation structure 1160 may then be formed on the layer stack including circuit board 1110, processor 1120, sensor array 1130, and cover glass 1140 using, for example, overmolding techniques. Encapsulation structure 1160 may include, for example, a plastic material, a dielectric material, an organic material, or any other non-conductive opaque material, such as epoxy resins. Encapsulation structure 1160 may not cover at least a portion of cover glass 1140 such that external light may reach sensor array 1130 through cover glass 1140.

A package top cover 1170 may be bonded or molded onto the layer stack and encapsulation structure 1160. Package top cover 1170 may be opaque and thus may block stray light and/or ambient light from reaching sensor array 1130. Package top cover 1170 may include an aperture where two lens assemblies may be seated side-by-side. In the illustrated example, the two lens assemblies may be held by a lens holder 1175. The first lens assembly may include a first lens 1180 and a second lens 1190, while the second lens assembly may include a first lens 1185 and a second lens 1195. In the illustrated example, the four lenses may be assembled (e.g., glued or molded) with lens holder 1175 to form the lens assembly, and package top cover 1170 may be overmolded with the lens assembly. In some embodiments, the lenses may be molded in place with package top cover 1170 without using a lens holder. In some embodiments, the lenses may be small lenses, such as lenses with a diameter less than about 2 mm or less than about 1 mm (e.g., between about 0.1 mm and about 1 mm). In some embodiments, the distance between first lens 1180 and cover glass 1140 may be between about 0.4 mm and about 2 mm.

A filter 1182 may be formed on a bottom surface of first lens 1080 of the first lens assembly. Filter 1182 may block (e.g., absorb or reflect) visible light and may allow NIR or SWIR light to pass through. For example, filter 1182 may include an NIR bandpass filter or a filter that may allow light with long wavelengths (e.g., >700 or 750 nm) to pass through. In some embodiments, a second filter (not shown in FIG. 11) may be coated on the bottom surface of first lens 1185 of the second lens assembly, where the second filter may block IR light and allow visible light to pass through.

In the example shown in FIG. 11, visible and infrared light reflected by a target object (e.g., an eye) may be collected and focused onto sensor array 1130 by the two lens assemblies. A portion of the collected light may be focused by the first lens assembly, filtered by filter 1182 to block visible light and transmit MR or SWIR light, projected onto a first region of sensor array 1130, and captured by the first region of sensor array 1130 to form a first image of the target object based on the NIR or SWIR light reflected by the target object. Another portion of the collected light may be focused by the second lens assembly, unfiltered or optionally filtered by another filter to block NIR or SWIR light and transmit visible light, projected onto a second region of sensor array 1130, and captured by the second region of sensor array 1130 to form a second image of the target object based on the visible light reflected by the target object. In this way, two or more images of the target object may be captured using light in different wavelength bands, such that at least one of the images may reveal detailed features of the target object, such as the features of the iris of an eye with a brown iris or a blue iris. The two images may be processed by processor 1120 and/or may be sent to another processor outside of image sensor device 1100 for further processing, such as determining the position or gaze direction of the eye or authenticating a user.

Figure 12:
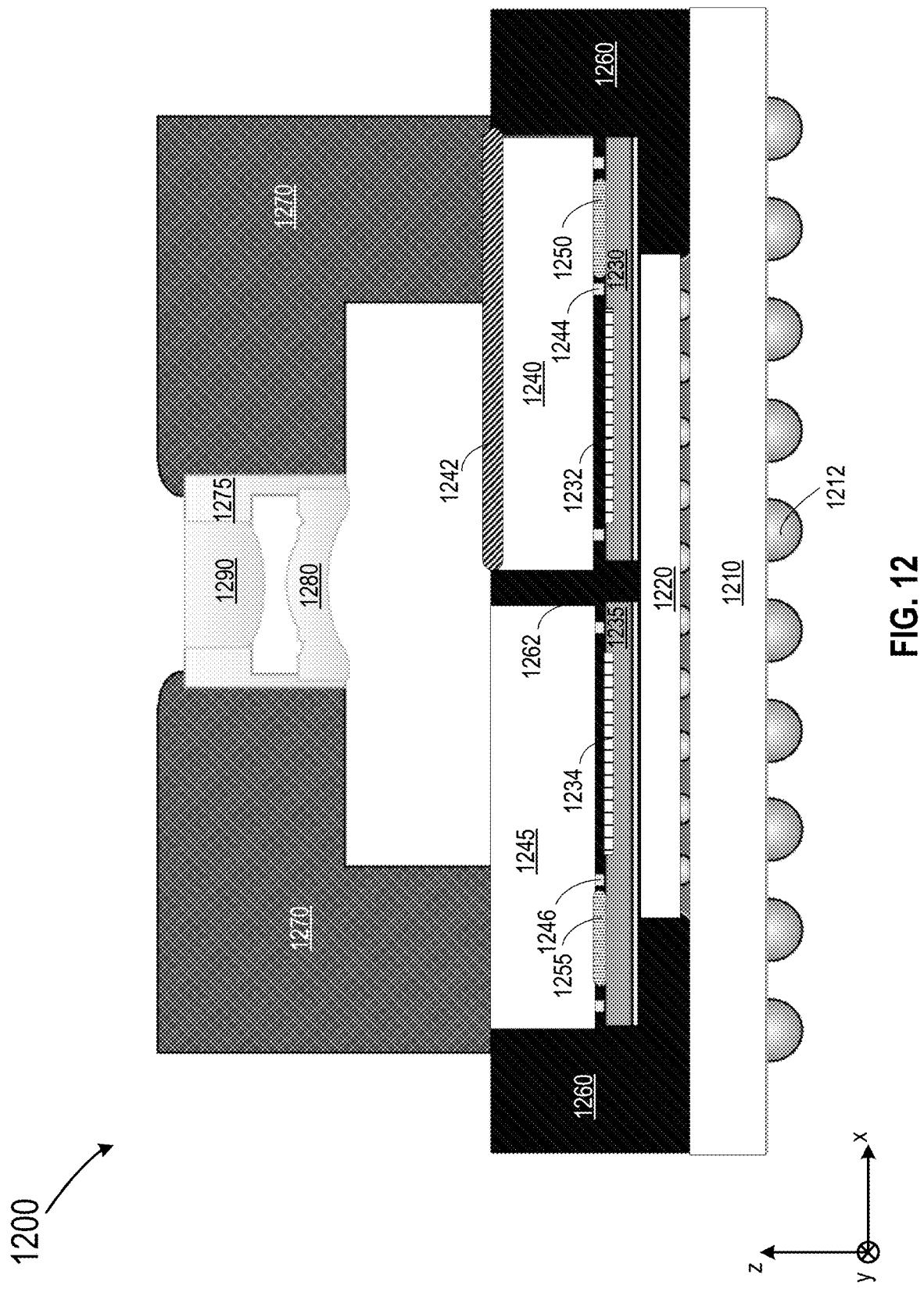
FIG. 12 illustrates an example of an image sensor device including a single lens assembly, two image sensor arrays, and a processor in a same package for capturing two images of an object according to certain embodiments.

FIG. 12 illustrates an example of an image sensor device 1200 including a single lens assembly, two sensor arrays 1230 and 1250, and a processor 1220 in a same package for capturing two images of an object according to certain embodiments. In the illustrated example, image sensor device 1200 may include a circuit board 1210 (e.g., a PCB), which may be similar to circuit board 330, 510, or 1010 described above. Circuit board 1210 may include connectors 1212 (e.g., solder balls) at one side (e.g., the bottom side), for example, for soldering to a larger PCB board. Circuit board 1210 may also include connectors (e.g., bonding pads) on the other side (e.g., the top side). Processor 1220 may be bonded to the bonding pads on circuit board 1210. Sensor arrays 1230 and 1235 may be physically bonded to different regions of processor 1220 using, for example, an epoxy, and may be electrically bonded to circuit board 1210 and/or processor 1220 using, for example, bonding wires.

Sensor array 1230 may include a two-dimensional array of sensor pixels 1232 that may be sensitive to, for example, visible light, NIR light, and/or SWIR light. A cover glass 1240 may be placed on top of sensor array 1230 to protect sensor array 1230. In regions where sensor pixels 1232 are located, there may be a spacer 1244 between sensor array 1230 and cover glass 1240. In other regions of sensor array 1230, sensor array 1230 and cover glass 1240 may be bonded together by a bonding material 1250 (e.g., glue or epoxy). A filter 1242 may be formed on a surface (e.g., top surface in the illustrated example) of cover glass 1240. Filter 1242 may block (e.g., absorb or reflect) visible light and may allow NIR or SWIR light to pass through. For example, filter 1242 may include an NIR bandpass filter or a filter that may allow light with long wavelengths (e.g., >700 or 750 nm) to pass through. Sensor array 1235 may also include a two-dimensional array of sensor pixels 1234 that may be sensitive to, for example, visible light, NIR light, and/or SWIR light. A cover glass 1245 may be placed on top of sensor array 1235 to protect sensor array 1235. In regions where sensor pixels 1234 are located, there may be a spacer 1246 between sensor array 1235 and cover glass 1245. In other regions of sensor array 1235, sensor array 1235 and cover glass 1245 may be bonded together by a bonding material 1255 (e.g., glue or epoxy). In some embodiments, a filter may be optionally coated on a surface (e.g., a top surface or a bottom surface) of cover glass 1245 or sensor array 1235 to block IR light and transmit visible light. Sensor arrays 1230 and 1235 may each have a small size, such as less than about 2×2 mm$^2$ or less than about 1×1 mm$^2$ (e.g., about 0.5×0.5 mm$^2$). In some embodiments, sensor array 1230 and sensor array 1235 may be on two different regions of a same die.

An encapsulation structure 1260 may then be formed on the layer stack including circuit board 1210, processor 1220, sensor array 1230, cover glass 1240, and filter 1242 using, for example, overmolding techniques. Encapsulation structure 1260 may include, for example, a plastic material, a dielectric material, an organic material, or any other non-conductive opaque material, such as epoxy resins described above. Encapsulation structure 1260 may surround the layer stack and may fill some gaps in the layer stack, such as the gap between sensor arrays 1230 and 1235 and the gap between cover glass 1240 and cover glass 1245, but may not fill the gap between sensor array 1230 and cover glass 1240 formed by spacer 1244 or the gap between sensor array 1235 and cover glass 1245 formed by spacer 1246. Encapsulation structure 1260 may include a region 1262 between sensor array 1230/cover glass 1240 and sensor array 1235/cover glass 1245. Region 1262 of encapsulation structure 1260 may isolate the two sensor arrays to prevent stray light or ghost images. Encapsulation structure 1260 may not cover at least a portion of cover glass 1240 and at least a portion of cover glass 1245 such that external light may reach sensor arrays 1230 and 1235 through cover glasses 1240 and 1245, respectively.

A package top cover 1270 may be bonded or molded onto the layer stack and encapsulation structure 1260. Package top cover 1270 and encapsulation structure 1260 may be opaque and thus may block stray light and/or ambient light from reaching sensor arrays 1230 and 1235. Package top cover 1270 may include an aperture where a lens assembly may be seated. In the illustrated example, the lens assembly may include a lens holder 1275 that holds a first lens 1280 and a second lens 1290. First lens 1280 and second lens 1290 may be assembled (e.g., glued or molded) with lens holder 1275 to form the lens assembly, and package top cover 1270 may be overmolded with the lens assembly. In some embodiments, lenses 1280 and 1290 may be molded in place with package top cover 1270 without using a lens holder. In some embodiments, lenses 1280 and 1290 may be small lenses, such as lenses with a diameter less than about 2 mm or less than about 1 mm (e.g., between about 0.1 mm and about 1 mm). In some embodiments, the distance between first lens 1280 and cover glass 1240 may be between about 0.4 mm and about 2 mm.

In the example shown in FIG. 12, visible and infrared light reflected by a target object (e.g., an eye) may be collected and projected onto sensor arrays 1230 and 1235 by the lens assembly. A portion of the projected light may be filtered by filter 1242 to block visible light and transmit NIR or SWIR light, which may be captured by sensor array 1230 to form an image of the target object based on the NIR or SWIR light reflected by the target object. Another portion of the project light may not be filtered or may be filtered by another filter to block NIR or SWIR light and transmit visible light, which may be captured by sensor array 1235 to form another image of the target object based on the visible light reflected by the target object. In this way, two or more images of the target object may be captured using light in different wavelength bands, such that at least one of the images may reveal detailed features of the target object, such as the features of the iris of an eye with a brown iris or a blue iris. The two images may be processed by processor 1220 and/or may be sent to another processor outside of image sensor device 1200 for further processing, such as determining the position or gaze direction of the eye or authenticating a user.

Figure 13:
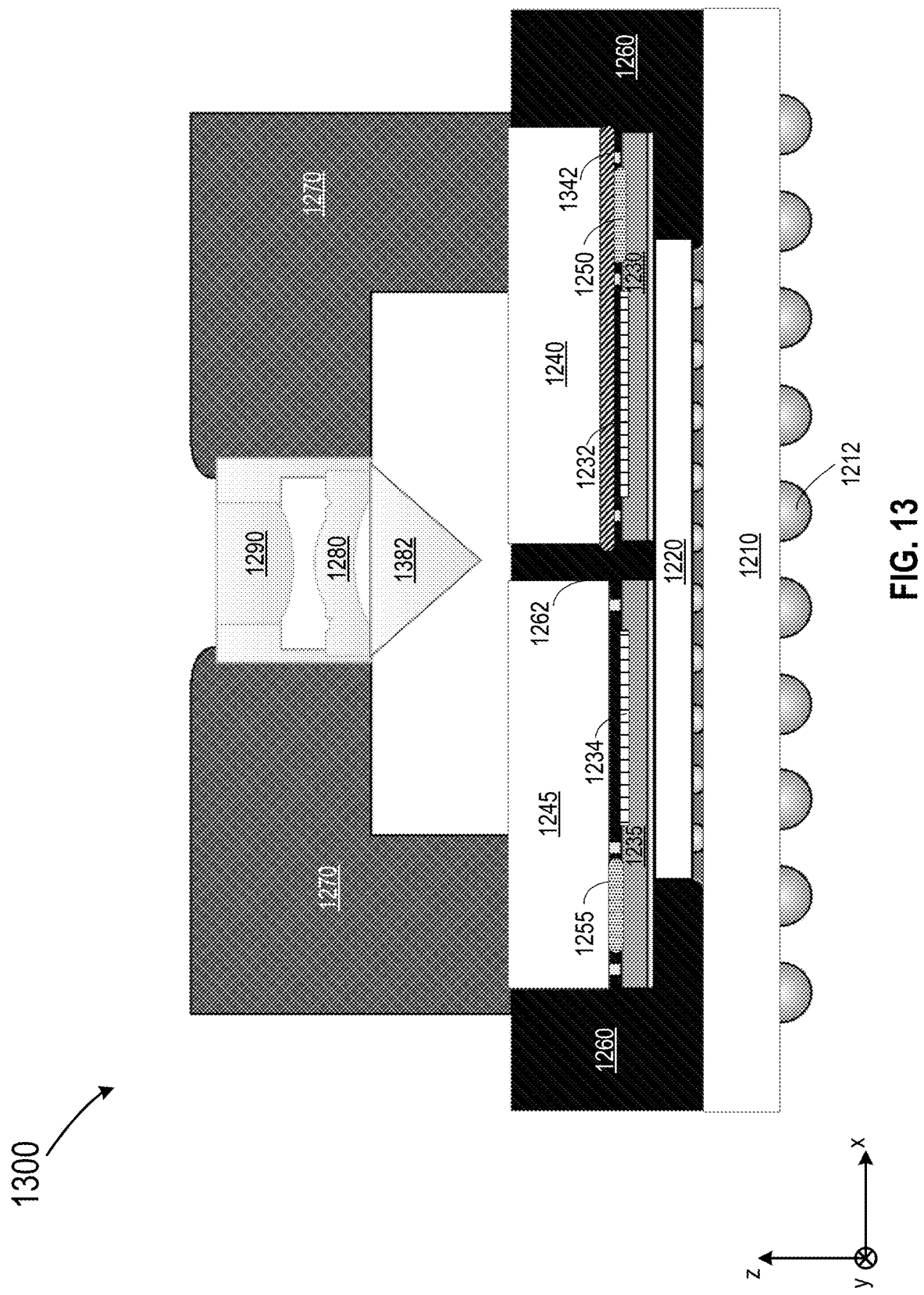
FIG. 13 illustrates another example of an image sensor device including a single lens assembly, two image sensor arrays, and a processor in a same package for capturing two images of an object according to certain embodiments.

FIG. 13 illustrates another example of an image sensor device 1300 including a single lens assembly, two sensor arrays, and a processor in a same package for capturing two images of an object according to certain embodiments. Image sensor device 1300 may be similar to image sensor device 1200, but may include a filter 1342 at a bottom surface of cover glass 1240 and may include a beam splitter 1382 for splitting light reflected by the object (e.g., an eye) and collected and focused by the lens assembly. Filter 1342 may block visible light and transmit NIR or SWIR light. Beam splitter 1382 may refract a first portion of the incoming light towards sensor array 1230 and refract a second portion of the incoming light towards sensor array 1235. The first portion of the incoming light may pass through cover glass 1240 and may be filtered by filter 1342 before reaching sensor array 1230, and may then be captured by sensor array 1230 to form an image of the object based on the NIR or SWIR light reflected by the object. The second portion of the incoming light may pass through cover glass 1245 and may optionally be filtered by a filter that blocks IR light and transmits visible light before reaching sensor array 1235, and may then be captured by sensor array 1235 to form another image of the object based on the visible light reflected by the object. In one example, beam splitter 1382 may include a triangular prism, such as an equilateral triangular prism that may equally split the incoming light beam.

Figure 14:
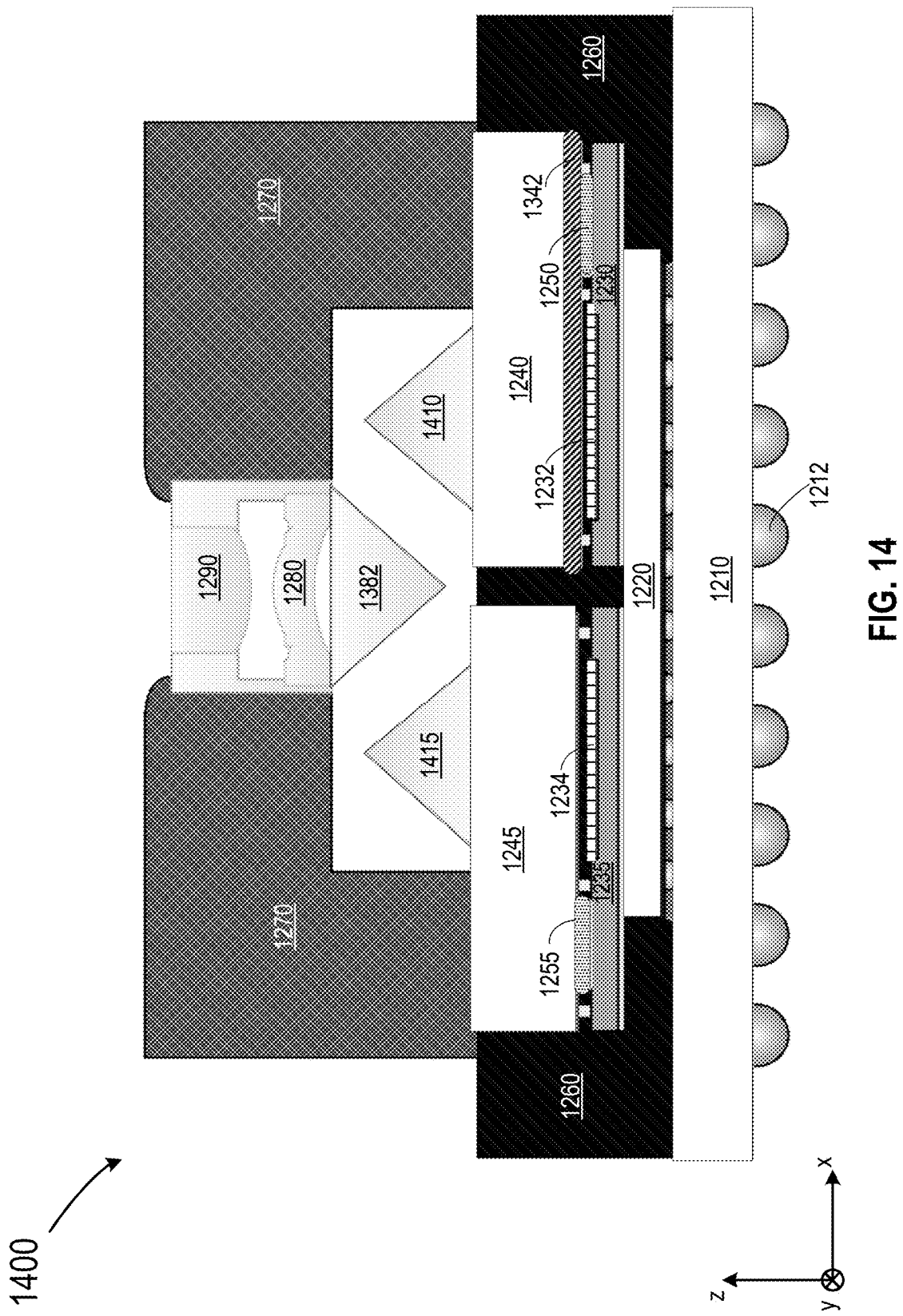
FIG. 14 illustrates another example of an image sensor device including a single lens assembly, two image sensor arrays, and a processor in a same package for capturing two images of an object according to certain embodiments.

FIG. 14 illustrates another example of an image sensor device 1400 including a single lens assembly, two sensor arrays, and a processor in a same package for capturing two images of an object according to certain embodiments. Image sensor device 1400 may be similar to image sensor device 1300, and may include two additional prisms 1410 and 1415 positioned on top of cover glass 1240 and cover glass 1245, respectively. In the illustrated example, light (including visible and IR light) reflected by the object (e.g., an eye) and collected and focused by the lens assembly may be split by beam splitter 1382. Beam splitter 1382 may refract a first portion of the incoming light towards sensor array 1230 and refract a second portion of the incoming light towards sensor array 1235. The first portion of the incoming light may be refracted again by prism 1410 (which may change the propagation directions of the light rays back to their propagation directions before being refracted by beam splitter 1382), pass through cover glass 1240, be filtered by filter 1342 before reaching sensor array 1230, and then be captured by sensor array 1230 to form an image of the object based on the NIR or SWIR light reflected by the object. The second portion of the incoming light may be refracted again by prism 1415 (which may change the propagation directions of the light rays back to their propagation directions before being refracted by beam splitter 1382), pass through cover glass 1245, optionally be filtered by a filter that may block IR light and transmit visible light before reaching sensor array 1235, and then be captured by sensor array 1235 to form another image of the object based on the visible light reflected by the object. In one example, beam splitter 1382, prism 1410, and prism 1415 may be triangular prisms, such as equilateral triangular prisms.

It is noted that FIGS. 3-14 are not drawn to scale. In addition, in some embodiments, each lens assembly may include one lenses, two lenses, or more than two lenses in a lens group. The lenses may include spherical lenses, aspheric lenses, free-form lenses, and any other types of lens, and may be made using plastic, glass, or any other suitable materials. In some embodiments, an image sensor device may include more than two sensor arrays, such as three or four sensor arrays arranged according to a pattern. Due to the integration of two or more sensor arrays into a same package, the use of one processor to control or manage the two or more sensor arrays and to process data from the two or more sensor arrays, and the use of overmolding techniques to integrate the components into the same package, image sensor devices disclosed herein may have smaller sizes, lower cost, and lower power consumption compared to the combination of two separate image sensor devices in separate packages.

According to one or more aspects, any and/or all of the apparatus, modules, systems, image sensors, circuitry, methods, and/or method steps described in FIGS. 1-14 herein may be implemented by and/or in an electrical circuit or a computing device. Additionally or alternatively, any and/or all of the methods and/or method steps described herein may be implemented in computer-readable instructions, such as computer-readable instructions stored on a computer-readable medium, such as memory, storage or another computer-readable medium.

Figure 15:
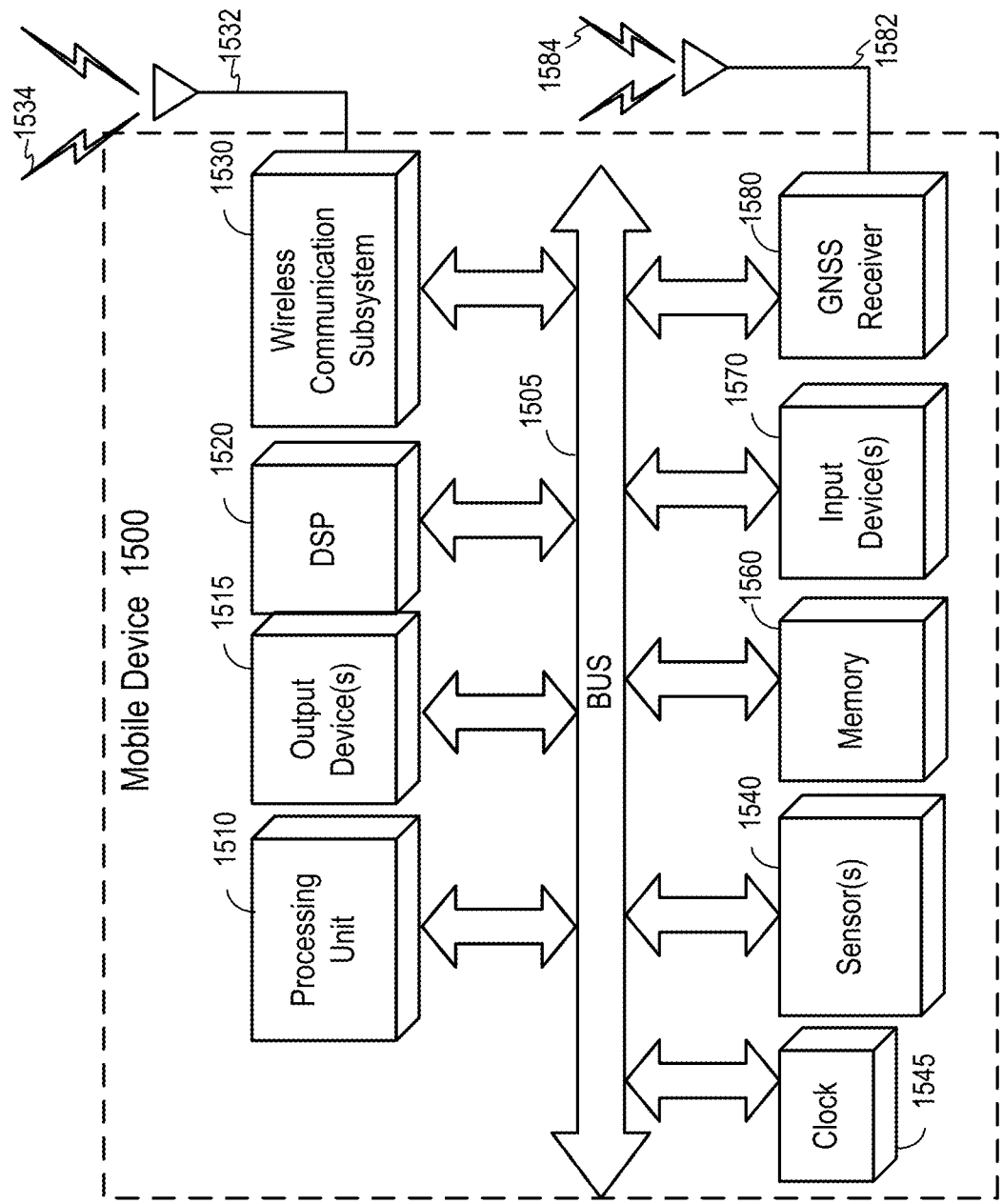
FIG. 15 is a block diagram of an example of a mobile device for implementing some of the embodiments described herein.

FIG. 15 illustrates an embodiment of a mobile device 1500 for implementing some of the embodiments described herein. For example, mobile device 1500 can be used in mobile device 105, or can be used to perform at least some operations described above. It should be noted that FIG. 15 is meant only to provide a generalized illustration of various components, any or all of which may be utilized as appropriate.

Mobile device 1500 is shown comprising hardware elements that can be electrically coupled via a bus 1505 (or may otherwise be in communication, as appropriate). The hardware elements may include a processing unit(s) 1510 which can include without limitation one or more general-purpose processors, one or more special-purpose processors (such as digital signal processing chips, graphics acceleration processors, application-specific integrated circuits (ASICs), and/or the like), and/or other processing structure or means, which can be configured to perform one or more of the methods described herein. As shown in FIG. 15, some embodiments may have a separate digital signal processor (DSP) 1520, depending on the desired functionality. Mobile device 1500 also can include one or more input devices 1570, which can include without limitation a touch pad, button(s), dial(s), switch(es), and/or the like; and one or more output devices 1515, which can include without limitation light emitting diodes (LEDs), speakers, and/or the like. For example, the LEDs may be used to transmit VLC signals.

Mobile device 1500 might also include a wireless communication subsystem 1530, which can include without limitation a wireless communication device, and/or a chipset (such as a Bluetooth device, an International Electrical and Electronics Engineers (IEEE) 802.11 device (e.g., a device utilizing one or more of the 802.11 standards described herein), an IEEE 802.15.4 device, a WiFi device, a WiMax device, cellular communication facilities, etc.), and/or the like. Wireless communication subsystem 1530 may permit data to be exchanged with a network, wireless access points, other computer systems, and/or any other electronic devices described herein, such as a mobile device or a remote controller. The communication can be carried out via one or more wireless communication antenna(s) 1532 that send and/or receive wireless signals 1534.

Depending on the desired functionality, wireless communication subsystem 1530 can include a separate transmitter and receiver, or any combination of transceivers, transmitters, and/or receivers to communicate with base stations (e.g., ng-eNBs and gNBs) and other terrestrial transceivers, such as wireless devices and access points. Mobile device 1500 may communicate with different data networks that may comprise various network types. For example, a Wireless Wide Area Network (WWAN) may be a code division multiple access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, a WiMax (IEEE 802.16) network, and so on. A CDMA network may implement one or more Radio Access Technologies (RATs), such as CDMA2000, Wideband CDMA (WCDMA), and so on. CDMA2000 includes IS-95, IS-2000, and/or IS-856 standards. A TDMA network may implement Global System for Mobile Communications (GSM), Digital Advanced Mobile Phone System (D-AMPS), or some other RAT. An OFDMA network may employ Long-Term Evolution (LTE), LTE Advanced, 5G New Radio (NR), and so on. 5G NR, LTE, LTE Advanced, GSM, and WCDMA are described in documents from the 3rd Generation Partnership Project (3GPP). CDMA2000 is described in documents from a consortium named "3rd Generation Partnership Project 2" (3GPP2). 3GPP and 3GPP2 documents are publicly available. A wireless local area network (WLAN) may also be an IEEE 802.11x network, and a wireless personal area network (WPAN) may be a Bluetooth network, an IEEE 802.15x, or some other type of network. The techniques described herein may also be used for any combination of WWAN, WLAN, and/or WPAN.

Mobile device 1500 may include a clock 1545 on bus 1505, which can generate a signal to synchronize various components on bus 1505. Clock 1545 may include an inductor-capacitor (LC) oscillator, a crystal oscillator, a ring oscillator, a digital clock generator (e.g., a clock divider or a clock multiplexer), a phase locked loop, or other clock generators. Clock 1545 may be synchronized (or substantially synchronized) with corresponding clocks on other wireless devices for data communication. Clock 1545 may be driven by wireless communication subsystem 1530, which may be used to synchronize clock 1545 of mobile device 1500 to one or more other devices. Clock 1545 may be used as the time base or reference for synchronizing different components of mobile device 1500.

Mobile device 1500 can further include sensor(s) 1540. Such sensors can include, without limitation, one or more acoustic sensor(s), accelerometer(s), gyroscope(s), camera(s), magnetometer(s), altimeter(s), microphone(s), proximity sensor(s), light sensor(s), and the like. Some or all of sensor(s) 1540 can be utilized, among other things, for light signal detection, motion detection, and positioning.

Embodiments of the mobile device may also include a Global Navigation Satellite System (GNSS) receiver 1580 capable of receiving signals 1584 from one or more GNSS satellites using a GNSS antenna 1582. Positioning based on GNSS signal measurement can be utilized to complement and/or incorporate the techniques described herein. The GNSS receiver 1580 can extract a position of the mobile device 1500, using conventional techniques, from GNSS space vehicles (SVs) of a GNSS system, such as Global Positioning System (GPS), Galileo, Globalnaya Navigazionnaya Sputnikovaya Sistema (GLONASS), Quasi-Zenith Satellite System (QZSS) over Japan, Indian Regional Navigational Satellite System (IRNSS) over India, BeiDou Navigation Satellite System (BDS) over China, and/or the like. Moreover, GNSS receiver 1580 can be used with various augmentation systems (e.g., a Satellite-Based Augmentation System (SBAS)) that may be associated with or otherwise enabled for use with one or more global and/or regional navigation satellite systems, such as, e.g., Wide Area Augmentation System (WAAS), European Geostationary Navigation Overlay Service (EGNOS), Multi-functional Satellite Augmentation System (MSAS), and Geo Augmented Navigation system (GAGAN), and/or the like.

Mobile device 1500 may further include and/or be in communication with a memory 1560. Memory 1560 may include any non-transitory storage device, and may include, without limitation, local and/or network accessible storage, a disk drive, a drive array, an optical storage device, a solid-state storage device, such as a random access memory (RAM), and/or a read-only memory (ROM), which can be programmable, flash-updateable, and/or the like. Such storage devices may be configured to implement any appropriate data stores, including without limitation, various file systems, database structures, and/or the like. For instance, memory 1560 may include a database (or other data structure) configured to store information such as the captured image data.

Memory 1560 of mobile device 1500 also can comprise software elements (not shown), including an operating system, device drivers, executable libraries, and/or other code, such as one or more application programs, which may comprise computer programs provided by various embodiments, and/or may be designed to implement methods, and/or configure systems, provided by other embodiments, as described herein. Merely by way of example, one or more procedures described with respect to the functionality discussed above might be implemented as code and/or instructions that can be stored or loaded in memory 1560 and be executed by mobile device 1500, a processing unit within mobile device 1500, and/or another device of a wireless system. In an aspect, such code and/or instructions can be used to configure and/or adapt a general-purpose computer (or other devices) to perform one or more operations in accordance with the described methods.

Figure 16:
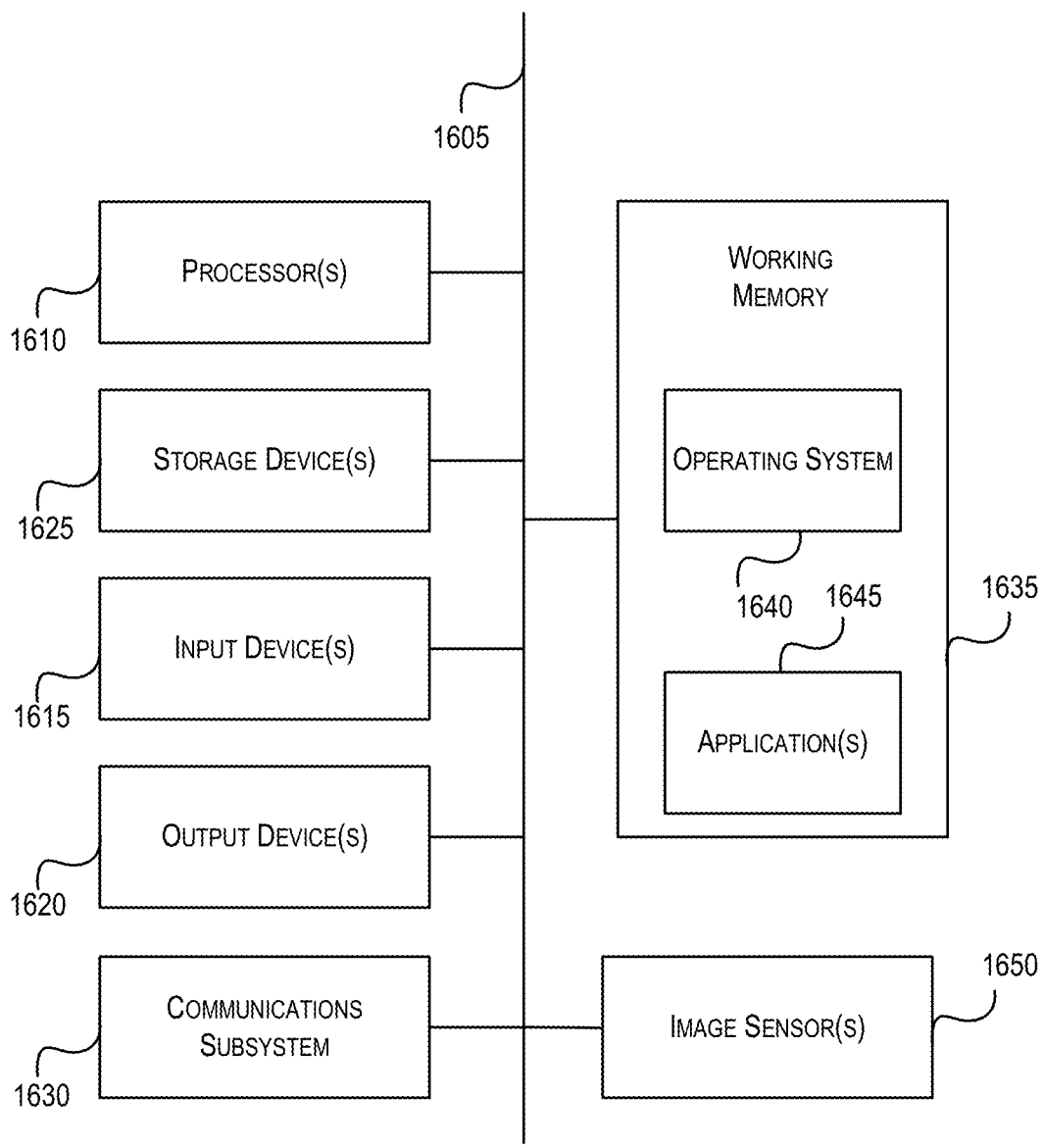
FIG. 16 is a block diagram of an example of a computing device for implementing some of the embodiments described herein.

FIG. 16 illustrates an example of a computing device 1600 for implementing some of the embodiments described herein. For example, computing device 1600 may represent some of the components of a mobile device or any other computing device. Examples of computing device 1600 include, but are not limited to, desktops, workstations, personal computers, supercomputers, video game consoles, tablets, smart phones, laptops, netbooks, or other portable devices. For example, computing device 1600 may be used to implement computer vision system 200. FIG. 16 provides a schematic illustration of one embodiment of computing device 1600 that may perform the methods provided by various other embodiments, as described herein, and/or may function as the host computing device, a remote kiosk/terminal, a point-of-sale device, a mobile multifunction device, a set-top box and/or a computing device. FIG. 16 is meant only to provide a generalized illustration of various components, any or all of which may be utilized as appropriate. FIG. 16, therefore, broadly illustrates how individual system elements may be implemented in a relatively separated or relatively more integrated manner.

Computing device 1600 is shown comprising hardware elements that may be electrically coupled via a bus 1605 (or may otherwise be in communication, as appropriate). The hardware elements may include one or more processors 1610, including, without limitation, one or more general-purpose processors and/or one or more special-purpose processors (such as digital signal processing chips, graphics acceleration processors, and/or the like); one or more input devices 1615, which may include, without limitation, one or more sensors 1650, a touch screen, a mouse, a keyboard and/or the like; and one or more output devices 1620, which may include, without limitation, a display unit, a printer and/or the like. Sensors 1650 may include image/vision sensors, olfactory sensors and/or chemical sensors.

Computing device 1600 may further include (and/or be in communication with) one or more non-transitory storage devices 1625, which may comprise, without limitation, local and/or network accessible storage, and/or may include, without limitation, a disk drive, a drive array, an optical storage device, a solid-form storage device such as a RAM and/or a read-only memory (ROM), which may be programmable, flash-updateable and/or the like. Such storage devices may be configured to implement any appropriate data storage, including, without limitation, various file systems, database structures, and/or the like.

Computing device 1600 may also include a communications subsystem 1630. Communications subsystem 1630 may include a transceiver for receiving and transmitting data or a wired and/or wireless medium. Communications subsystem 1630 may also include, without limitation, a modem, a network card (wireless or wired), an infrared communication device, a wireless communication device and/or chipset (such as a Bluetooth™ device, an 802.11 device, a WiFi device, a WiMax device, cellular communication facilities, etc.), and/or the like. Communications subsystem 1630 may permit data to be exchanged with a network, other computing devices, and/or any other devices described herein. In many embodiments, computing device 1600 may further comprise a non-transitory working memory 1635, which may include a RAM or ROM device, as described above.

Computing device 1600 may comprise software elements, shown as being currently located within the working memory 1635, including an operating system 1640, device drivers, executable libraries, and/or other code, such as one or more application programs 1645, which may comprise computer programs provided by various embodiments, and/ or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer), such as the example method illustrated in FIG. 11; in an aspect, then, such code and/or instructions may be used to configure and/or adapt a general-purpose computer (or other device) to perform one or more operations in accordance with the described methods.

A set of these instructions and/or code might be stored on a computer-readable storage medium, such as storage device(s) 1625 described above. In some cases, the storage medium might be incorporated within a computing device, such as computing device 1600. In other embodiments, the storage medium might be separate from a computing device (e.g., a removable medium, such as a compact disc), and/or provided in an installation package, such that the storage medium may be used to program, configure and/or adapt a general-purpose computer with the instructions/code stored thereon. These instructions might take the form of executable code, which is executable by computing device 1600 and/or might take the form of source and/or installable code, which, upon compilation and/or installation on computing device 1600 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices 1600 such as network input/output devices may be employed.

Some embodiments may employ a computing device (such as computing device 1600) to perform methods in accordance with the disclosure. For example, some or all of the procedures of the described methods may be performed by computing device 1600 in response to processor 1610 executing one or more sequences of one or more instructions (which might be incorporated into operating system 1640 and/or other code, such as an application program 1645) contained in working memory 1635. Such instructions may be read into working memory 1635 from another computer-readable medium, such as one or more storage device(s) 1625. Merely by way of example, execution of the sequences of instructions contained in working memory 1635 might cause processor(s) 1610 to perform one or more procedures of the methods described herein.

The terms "machine-readable medium" and "computer-readable medium," as used herein, refer to any medium that participates in providing data that causes a machine to operate in a specific fashion. In an embodiment implemented using computing device 1600, various computer-readable media might be involved in providing instructions/code to processor(s) 1610 for execution and/or might be used to store and/or carry such instructions/code (e.g., as signals). In many implementations, a computer-readable medium is a physical and/or tangible storage medium. Such a medium may take many forms, including, but not limited to, non-volatile media, volatile media, and transmission media. Non-volatile media include, for example, optical and/or magnetic disks, such as storage device(s) 1625. Volatile media include, without limitation, dynamic memory, such as working memory 1635. Transmission media include, without limitation, coaxial cables, copper wire, and fiber optics, including the wires comprising the bus 1605, as well as the various components of communications subsystem 1630 (and/or the media by which communications subsystem 1630 provides communication with other devices). Hence, transmission media may also take the form of waves (including, without limitation, radio, acoustic and/or light waves, such as those generated during radio-wave and infrared data communications). In an alternate embodiment, event-driven components and devices, such as cameras, may be used, where some of the processing may be performed in the analog domain.

With reference to the appended figures, components that can include memory can include non-transitory machine-readable media. The term "machine-readable medium" and "computer-readable medium" as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Common forms of physical and/or tangible computer-readable media include, for example, a floppy disk, a flexible disk, hard disk, magnetic tape, or any other magnetic medium, a compact disc read-only memory (CD-ROM), any other optical medium, punch cards, paper tape, any other physical medium with patterns of holes, a RAM, a PROM, an erasable programmable read-only memory (EPROM), a FLASH-EPROM, any other memory chip or cartridge, a carrier wave as described hereinafter, or any other medium from which a computer may read instructions and/or code.

Various forms of computer-readable media may be involved in carrying one or more sequences of one or more instructions to processor(s) 1610 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computing device 1600. These signals, which might be in the form of electromagnetic signals, acoustic signals, optical signals and/or the like, are all examples of carrier waves on which instructions may be encoded, in accordance with various embodiments of the invention.

Communications subsystem 1630 (and/or components thereof) generally will receive the signals, and bus 1605 then might carry the signals (and/or the data, instructions, etc., carried by the signals) to working memory 1635, from which processor(s) 1610 retrieves and executes the instructions. The instructions received by working memory 1635 may optionally be stored on a non-transitory storage device 1625 either before or after execution by processor(s) 1610.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

It will be apparent to those skilled in the art that substantial variations may be made in accordance with specific implementations. For example, customized hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The terms "machine-readable medium" and "computer-readable medium" as used herein refer to any storage medium that participates in providing data that causes a machine to operate in a specific fashion. In embodiments provided hereinabove, various machine-readable media might be involved in providing instructions/code to processors and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media, punch cards, paper tape, any other physical medium with patterns of holes, a RAM, a programmable read-only memory (PROM), an EPROM, a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this specification discussion utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or a similar special purpose electronic computing device.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of the claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In some implementations, operations or processing may involve physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining," or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or a similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

For an implementation involving firmware and/or software, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. The memory may be implemented within the processor unit or external to the processor unit. As used herein the term "memory" refers to any type of long term, short term, volatile, nonvolatile, or other memory and is not to be limited to any particular type of memory, any particular number of memory devices, or any particular type of media upon which memory is stored.

If implemented in firmware and/or software, the functions may be stored as one or more instructions or code on a computer-readable storage medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, electrically erasable programmable read-only memory (EEPROM), CD-ROM or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on a computer-readable storage medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims. That is, the communication apparatus includes transmission media with signals indicative of information to perform disclosed functions. At the first time, the transmission media included in the communication apparatus may include a first portion of the information to perform the disclosed functions, while at a second time the transmission media included in the communication apparatus may include a second portion of the information to perform the disclosed functions.

In view of this description, embodiments may include different combinations of features. Implementation examples are described in the following numbered clauses:

Clause 1: An image sensor device comprising a circuit board; a processor bonded to the circuit board; a first sensor array bonded to and electrically coupled to the processor; a first cover glass on the first sensor array; a second sensor array bonded to and electrically coupled to the processor; a second cover glass on the second sensor array; an encapsulation structure on the circuit board and surrounding the processor, the first sensor array, the first cover glass, the second sensor array, and the second cover glass; a package top cover on the encapsulation structure, the package top cover including a first aperture and a second aperture aligned with the first sensor array and the second sensor array respectively; a first lens in the first aperture; a second lens in the second aperture; and a filter on a surface of at least one of the first lens, the first cover glass, or the first sensor array, the filter configured to block light in a first wavelength range and transmit light in a second wavelength range.

Clause 2: The image sensor device of clause 1, wherein the filter is configured to block visible light and transmit infrared light.

Clause 3: The image sensor device of any of clauses 1 and 2, wherein the first lens and the second lens are characterized by at least one of different respective focal lengths, different respective fields of view, different respective magnifications, or different distances from the first cover glass and the second cover glass respectively.

Clause 4: The image sensor device of any of clauses 1-3, wherein each of the first lens and the second lens is characterized by a diameter between 0.1 mm and 2 mm.

Clause 5: The image sensor device of any of clauses 1-4, wherein each of the first sensor array and the second sensor array is characterized by a light-sensitive region that is less than 1×1 mm$^2$.

Clause 6: The image sensor device of any of clauses 1-5, wherein the first lens includes a group of two or more lenses in a lens assembly.

Clause 7: The image sensor device of any of clauses 1-6, wherein wherein the first sensor array and the second sensor array are electrically coupled to the processor through the circuit board.

Clause 8: The image sensor device of any of clauses 1-7, wherein the first sensor array and the second sensor array on a same die.

Clause 9: The image sensor device of any of clauses 1-8, wherein the first sensor array and the second sensor array are optically isolated by the encapsulation structure and the package top cover.

Clause 10: The image sensor device of any of clauses 1-9, comprising an additional filter on a surface of at least one of the second lens, the second cover glass, or the second sensor array and configured to block light in the second wavelength range and transmit light in the first wavelength range.

Clause 11: An image sensor device comprising: a circuit board; a processor bonded to the circuit board; a first sensor array bonded to and electrically coupled to the processor; a first cover glass on the first sensor array; a second sensor array bonded to and electrically coupled to the processor; a second cover glass on the second sensor array; an encapsulation structure on the circuit board and surrounding the processor, the first sensor array, the first cover glass, the second sensor array, and the second cover glass; a package top cover on the encapsulation structure, the package top cover including an aperture; a lens in the aperture; and a filter on a surface of at least one of the first cover glass or the first sensor array, the filter configured to block light in a first wavelength range and transmit light in a second wavelength range.

Clause 12: The image sensor device of clause 11, further comprising a beam splitter optically coupled to the lens and configured to: direct a first portion of a light beam from the lens toward the first sensor array; and direct a second portion of the light beam from the lens toward the second sensor array.

Clause 13: The image sensor device of clause 12, wherein the beam splitter comprises a triangular prism.

Clause 14: The image sensor device of any of clauses 12 and 13, further comprising:

a first prism on the first cover glass and configured to refract the first portion of the light beam from the beam splitter; and a second prism on the second cover glass and configured to refract the second portion of the light beam from the beam splitter.

Clause 15: The image sensor device of any of clauses 11-14, wherein the filter is configured to block visible light and transmit infrared light.

Clause 16: The image sensor device of any of clauses 11-15, wherein the lens is characterized by a diameter between 0.1 mm and 2 mm.

Clause 17: The image sensor device of any of clauses 11-16, wherein each of the first sensor array and the second sensor array is characterized by a light-sensitive region that is less than 1×1 mm$^2$.

Clause 18: The image sensor device of any of clauses 11-17, wherein the lens includes a group of two or more lenses in a lens assembly.

Clause 19: The image sensor device of any of clauses 11-18, wherein the first sensor array and the second sensor array are on two different regions of a same die.

Clause 20: The image sensor device of any of clauses 11-19, wherein the first sensor array and the second sensor array are electrically coupled to the processor through the circuit board.

Clause 21: An optical sensor package comprising: a circuit board; a processor bonded to the circuit board; a sensor array bonded to and electrically coupled to the processor; a cover glass on the sensor array; an encapsulation structure on the circuit board and surrounding the processor, the sensor array, and the cover glass; a top cover on the encapsulation structure, the top cover including an aperture; a lens assembly in the aperture; and a filter on a region of at least one of the lens assembly, the cover glass, or the sensor array, the filter configured to block light in a first wavelength range and transmit light in a second wavelength range.

Clause 22: The optical sensor package of clause 21, wherein the filter is configured to block visible light and transmit infrared light.

Clause 23: The optical sensor package of any of clauses 21 and 22, wherein: the lens assembly includes a first lens and a second lens arranged side-by-side; and the filter is on a surface of the first lens.

Clause 24: The optical sensor package of any of clauses 21-23, wherein the lens assembly is characterized by a diameter between 0.1 mm and 2 mm.

Clause 25: The optical sensor package of any of clauses 21-24, wherein the sensor array is characterized by a light-sensitive region that is less than 2×2 mm$^2$.

Clause 26: An apparatus in a package, the apparatus comprising: means for focusing light reflected by an object, the light reflected by the object including light in a first wavelength range and light in a second wavelength range; means for blocking the light in the second wavelength range and transmitting the light in the first wavelength range; means for receiving and converting the light in the first wavelength range into electrical data for a first image; means for receiving and converting the light in the second wavelength range into electrical data for a second image; means for receiving and processing both the electrical data for the first image and the electrical data for the second image; means for encapsulating the means for receiving and converting the light in the first wavelength range, the means for receiving and converting the light in the second wavelength range, and the means for receiving and processing both the electrical data for the first image and the electrical data for the second image; and means for holding the means for focusing light reflected by the object, wherein the means for holding is on the means for encapsulating and is opaque to light in the first wavelength range and light in the second wavelength range.

Clause 27: The apparatus of clause 26, further comprising means for blocking light in the first wavelength range and transmitting light in the second wavelength range.

Clause 28: The apparatus of any of clauses 26 and 27, wherein the means for focusing the light reflected by the object comprises: a first means for focusing a portion of the light reflected by the object, the first means aligned with the means for receiving and converting the light in the first wavelength range; and a second means for focusing a second portion the light reflected by the object, the second means aligned with the means for receiving and converting the light in the second wavelength range.

Clause 29: The apparatus of any of clauses 26-28, further comprising means for splitting the light focused by the means for focusing light reflected by the object into a first portion and a second portion.

Clause 30: The apparatus of any of clauses 26-29, further comprising: means for directing the first portion of the light focused by the means for focusing light reflected by the object towards the means for receiving and converting the light in the first wavelength range; and means for directing the second portion of the light focused by the means for focusing light reflected by the object towards the means for receiving and converting the light in the second wavelength range.

What is claimed is:

1. An image sensor device comprising:
a circuit board;
a processor bonded to the circuit board;
a first sensor array bonded to and electrically coupled to the processor;
a first cover glass on the first sensor array;
a second sensor array bonded to and electrically coupled to the processor;
a second cover glass on the second sensor array;
an encapsulation structure on the circuit board and surrounding the processor, the first sensor array, the first cover glass, the second sensor array, and the second cover glass;
a package top cover on the encapsulation structure, the package top cover including a first aperture and a second aperture aligned with the first sensor array and the second sensor array respectively;
a first lens in the first aperture;
a second lens in the second aperture; and
a filter on a surface of at least one of the first lens, the first cover glass, or the first sensor array, the filter configured to block light in a first wavelength range and transmit light in a second wavelength range,
wherein the processor is on a single semiconductor chip and is configured to process electrical signals from both the first sensor array and the second sensor array.

2. The image sensor device of claim 1, wherein the filter is configured to block visible light and transmit infrared light.

3. The image sensor device of claim 1, wherein the first lens and the second lens are characterized by at least one of different respective focal lengths, different respective fields of view, different respective magnifications, or different distances from the first cover glass and the second cover glass respectively.

4. The image sensor device of claim 1, wherein each of the first lens and the second lens is characterized by a diameter between 0.1 mm and 2 mm.

5. The image sensor device of claim 1, wherein each of the first sensor array and the second sensor array is characterized by a light-sensitive region that is less than 1×1 mm$^2$.

6. The image sensor device of claim 1, wherein the first lens includes a group of two or more lenses in a lens assembly.

7. The image sensor device of claim 1, wherein the first sensor array and the second sensor array are electrically coupled to the processor through the circuit board.

8. The image sensor device of claim 1, wherein the first sensor array and the second sensor array on a same die.

9. The image sensor device of claim 1, wherein the first sensor array and the second sensor array are optically isolated by the encapsulation structure and the package top cover.

10. The image sensor device of claim 1, comprising an additional filter on a surface of at least one of the second lens, the second cover glass, or the second sensor array and configured to block light in the second wavelength range and transmit light in the first wavelength range.

11. An image sensor device comprising:
 a circuit board;
 a processor bonded to the circuit board;
 a first sensor array bonded to and electrically coupled to the processor;
 a first cover glass on the first sensor array;
 a second sensor array bonded to and electrically coupled to the processor;
 a second cover glass on the second sensor array;
 an encapsulation structure on the circuit board and surrounding the processor, the first sensor array, the first cover glass, the second sensor array, and the second cover glass;
 a package top cover on the encapsulation structure, the package top cover including an aperture;
 a lens in the aperture; and
 a filter on a surface of at least one of the first cover glass or the first sensor array, the filter configured to block light in a first wavelength range and transmit light in a second wavelength range,
 wherein the processor is on a single semiconductor chip and is configured to process electrical signals from both the first sensor array and the second sensor array.

12. The image sensor device of claim 11, further comprising a beam splitter optically coupled to the lens and configured to:
 direct a first portion of a light beam from the lens toward the first sensor array; and
 direct a second portion of the light beam from the lens toward the second sensor array.

13. The image sensor device of claim 12, wherein the beam splitter comprises a triangular prism.

14. The image sensor device of claim 12, further comprising:
 a first prism on the first cover glass and configured to refract the first portion of the light beam from the beam splitter; and
 a second prism on the second cover glass and configured to refract the second portion of the light beam from the beam splitter.

15. The image sensor device of claim 11, wherein the filter is configured to block visible light and transmit infrared light.

16. The image sensor device of claim 11, wherein the lens is characterized by a diameter between 0.1 mm and 2 mm.

17. The image sensor device of claim 11, wherein each of the first sensor array and the second sensor array is characterized by a light-sensitive region that is less than 1×1 mm$^2$.

18. The image sensor device of claim 11, wherein the lens includes a group of two or more lenses in a lens assembly.

19. The image sensor device of claim 11, wherein the first sensor array and the second sensor array are on two different regions of a same die.

20. The image sensor device of claim 11, wherein the first sensor array and the second sensor array are electrically coupled to the processor through the circuit board.

21. An optical sensor package comprising:
 a circuit board;
 a processor bonded to the circuit board;
 a sensor array on a first semiconductor chip bonded to and electrically coupled to the processor;
 a cover glass on the sensor array;
 an encapsulation structure on the circuit board and surrounding the processor, the sensor array, and the cover glass;
 a top cover on the encapsulation structure, the top cover including an aperture;
 a lens assembly in the aperture; and
 a filter on a region of at least one of the lens assembly, the cover glass, or the sensor array, the filter configured to block light in a first wavelength range and transmit light in a second wavelength range such that a first region of the sensor array receives the light in the second wavelength range but not the light in the first wavelength range while a second region of the sensor array receives the light in the first wavelength range,
 wherein the processor is on a second semiconductor chip and is configured to process electrical signals from both the first region and the second region of the sensor array.

22. The optical sensor package of claim 21, wherein the filter is configured to block visible light and transmit infrared light.

23. The optical sensor package of claim 21, wherein:
 the lens assembly includes a first lens and a second lens arranged side-by-side; and
 the filter is on a surface of the first lens.

24. The optical sensor package of claim 21, wherein the lens assembly is characterized by a diameter between 0.1 mm and 2 mm.

25. The optical sensor package of claim 21, wherein the sensor array is characterized by a light-sensitive region that is less than 2×2 mm$^2$.

26. An apparatus in a package, the apparatus comprising:
 means for focusing light reflected by an object, the light reflected by the object including light in a first wavelength range and light in a second wavelength range;
 means for blocking the light in the second wavelength range and transmitting the light in the first wavelength range;

means on a first semiconductor chip and for receiving and converting the light in the first wavelength range into electrical data for a first image;

means on a second semiconductor chip and for receiving and converting the light in the second wavelength range into electrical data for a second image;

means on a third semiconductor chip and for receiving and processing both the electrical data for the first image and the electrical data for the second image, wherein the first semiconductor chip and the second semiconductor chip are bonded to the third semiconductor chip, and wherein the third semiconductor chip is bonded to a circuit board;

means for encapsulating the means for receiving and converting the light in the first wavelength range, the means for receiving and converting the light in the second wavelength range, and the means for receiving and processing both the electrical data for the first image and the electrical data for the second image; and means for holding the means for focusing light reflected by the object, wherein the means for holding is on the means for encapsulating and is opaque to the light in the first wavelength range and the light in the second wavelength range.

27. The apparatus of claim 26, further comprising means for blocking light in the first wavelength range and transmitting light in the second wavelength range.

28. The apparatus of claim 26, wherein the means for focusing the light reflected by the object comprises:

a first means for focusing a portion of the light reflected by the object, the first means aligned with the means for receiving and converting the light in the first wavelength range; and a second means for focusing a second portion the light reflected by the object, the second means aligned with the means for receiving and converting the light in the second wavelength range.

29. The apparatus of claim 26, further comprising means for splitting the light focused by the means for focusing light reflected by the object into a first portion and a second portion.

30. The apparatus of claim 29, further comprising:

means for directing the first portion of the light focused by the means for focusing light reflected by the object towards the means for receiving and converting the light in the first wavelength range; and means for directing the second portion of the light focused by the means for focusing light reflected by the object towards the means for receiving and converting the light in the second wavelength range.

* * * * *